(12) United States Patent
Whitman et al.

(10) Patent No.: US 9,304,949 B2
(45) Date of Patent: *Apr. 5, 2016

(54) SENSING USER INPUT AT DISPLAY AREA EDGE

(71) Applicant: Microsoft Technology Licensing, LLC, Redmond, WA (US)

(72) Inventors: Christopher A. Whitman, Fort Collins, CO (US); Rajesh Manohar Dighde, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 17 days.

This patent is subject to a terminal disclaimer.

(21) Appl. No.: 14/059,280

(22) Filed: Oct. 21, 2013

(65) Prior Publication Data

US 2014/0043275 A1 Feb. 13, 2014

Related U.S. Application Data

(63) Continuation of application No. 13/651,195, filed on Oct. 12, 2012, now Pat. No. 8,614,666, which is a continuation of application No. 13/471,376, filed on May 14, 2012.

(Continued)

(51) Int. Cl.
*G06F 3/041* (2006.01)
*G06F 13/10* (2006.01)
(Continued)

(52) U.S. Cl.
CPC .............. *G06F 13/102* (2013.01); *G05B 11/01* (2013.01); *G06F 1/1618* (2013.01);
(Continued)

(58) Field of Classification Search
CPC .......... G06F 3/01; G06F 3/002; G06F 3/0202; G06F 3/0414; G06F 3/0416; G06F 1/1618; G06F 1/1681; G06F 1/1684; G06F 1/1669; G06F 1/1683; G06F 1/1654; G06F 1/1656; G06F 1/1662; H04M 1/0254; H04M 1/0245; H04M 1/0216; H04M 1/72275
USPC ........ 345/76, 102, 156–179; 313/512; 463/20
See application file for complete search history.

(56) References Cited

U.S. PATENT DOCUMENTS

| 578,325 A | 3/1897 | Fleming |
| 3,600,528 A | 8/1971 | Leposavic |

(Continued)

FOREIGN PATENT DOCUMENTS

| CA | 990023 | 6/1976 |
| CN | 1352767 | 6/2002 |

(Continued)

OTHER PUBLICATIONS

Williams, Jim "A Fourth Generation of LCD Backlight Technology", Retrieved from <http://cds.linear.com/docs/Application%20Note/an65f.pdf>, (Nov. 1995),124 pages.

(Continued)

*Primary Examiner* — Prabodh M Dharia
(74) *Attorney, Agent, or Firm* — Jeremy Snodgrass; Judy Ye; Micky Minhas

(57) ABSTRACT

One or more sensors are disposed to sense user inputs in an active display area as well as user inputs in an extended area that is outside of the active display area. Data for user inputs, such as gestures, may include data from user inputs sensed in both the active display area and outside of the active display area. The user inputs can begin and/or end outside of the active display area.

20 Claims, 10 Drawing Sheets

Related U.S. Application Data

(60) Provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | | |
|---|---|---|
| *H01H 13/79* | (2006.01) | |
| *H01H 13/78* | (2006.01) | |
| *H01H 13/785* | (2006.01) | |
| *G06F 3/02* | (2006.01) | |
| *G06F 1/16* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *H01H 13/704* | (2006.01) | |
| *H01H 13/82* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 3/023* | (2006.01) | |
| *G06F 3/0488* | (2013.01) | |
| *G06F 3/0487* | (2013.01) | |
| *H01H 13/807* | (2006.01) | |
| *H01H 11/00* | (2006.01) | |
| *H01H 9/26* | (2006.01) | |

(52) U.S. Cl.
CPC ............ *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 1/1686* (2013.01); *G06F 3/002* (2013.01); *G06F 3/01* (2013.01); *G06F 3/0202* (2013.01); *G06F 3/023* (2013.01); *G06F 3/0414* (2013.01); *G06F 3/0416* (2013.01); *G06F 3/0487* (2013.01); *G06F 3/0488* (2013.01); *G06F 9/541* (2013.01); *G06F 11/3089* (2013.01); *H01H 11/00* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/807* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2205/006* (2013.01); *H01H 2211/004* (2013.01); *H01H 2211/006* (2013.01); *H01H 2213/016* (2013.01); *H01H 2217/004* (2013.01); *H04M 1/0245* (2013.01); *Y10T 16/5401* (2015.01); *Y10T 16/551* (2015.01); *Y10T 29/49826* (2015.01)

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,243,861 A | 1/1981 | Strandwitz |
| 4,261,042 A | 4/1981 | Ishiwatari et al. |
| 4,302,648 A | 11/1981 | Sado et al. |
| 4,317,011 A | 2/1982 | Mazurk |
| 4,317,013 A | 2/1982 | Larson |
| 4,323,740 A | 4/1982 | Balash |
| 4,365,130 A | 12/1982 | Christensen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,576,436 A | 3/1986 | Daniel |
| 4,577,822 A | 3/1986 | Wilkerson |
| 4,588,187 A | 5/1986 | Dell |
| 4,607,147 A | 8/1986 | Ono et al. |
| 4,615,579 A | 10/1986 | Whitehead |
| 4,651,133 A | 3/1987 | Ganesan et al. |
| 4,652,704 A | 3/1987 | Franklin |
| 4,724,605 A | 2/1988 | Fiorella |
| 4,735,394 A | 4/1988 | Facco |
| 4,735,495 A | 4/1988 | Henkes |
| 4,795,977 A | 1/1989 | Frost et al. |
| 4,801,771 A | 1/1989 | Mizuguchi et al. |
| 4,824,268 A | 4/1989 | Diernisse |
| 4,864,084 A | 9/1989 | Cardinale |
| 4,990,900 A | 2/1991 | Kikuchi |
| 5,008,497 A | 4/1991 | Asher |
| 5,021,638 A | 6/1991 | Nopper et al. |
| 5,053,585 A | 10/1991 | Yaniger |
| 5,107,401 A | 4/1992 | Youn |
| 5,128,829 A | 7/1992 | Loew |
| 5,220,318 A | 6/1993 | Staley |
| 5,220,521 A | 6/1993 | Kikinis |
| 5,235,495 A | 8/1993 | Blair et al. |
| 5,253,362 A | 10/1993 | Nolan et al. |
| 5,283,559 A | 2/1994 | Kalendra et al. |
| 5,319,455 A | 6/1994 | Hoarty et al. |
| 5,331,443 A | 7/1994 | Stanisci |
| 5,339,382 A | 8/1994 | Whitehead |
| 5,363,075 A | 11/1994 | Fanucchi |
| 5,375,076 A | 12/1994 | Goodrich et al. |
| 5,404,133 A | 4/1995 | Moriike et al. |
| 5,406,415 A | 4/1995 | Kelly |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,576,981 A | 11/1996 | Parker et al. |
| 5,581,682 A | 12/1996 | Anderson et al. |
| 5,596,700 A | 1/1997 | Darnell et al. |
| 5,617,343 A | 4/1997 | Danielson et al. |
| 5,618,232 A | 4/1997 | Martin |
| 5,621,494 A | 4/1997 | Kazumi et al. |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,803,748 A | 9/1998 | Maddrell et al. |
| 5,806,955 A | 9/1998 | Parkyn, Jr. et al. |
| 5,807,175 A | 9/1998 | Davis et al. |
| 5,808,713 A | 9/1998 | Broer et al. |
| 5,818,361 A | 10/1998 | Acevedo |
| 5,828,770 A | 10/1998 | Leis et al. |
| 5,838,403 A | 11/1998 | Jannson et al. |
| 5,842,027 A | 11/1998 | Oprescu et al. |

(56) References Cited

U.S. PATENT DOCUMENTS

| | | |
|---|---|---|
| 5,861,990 A | 1/1999 | Tedesco |
| 5,874,697 A | 2/1999 | Selker et al. |
| 5,920,317 A | 7/1999 | McDonald |
| 5,921,652 A | 7/1999 | Parker et al. |
| 5,924,555 A | 7/1999 | Sadamori et al. |
| 5,926,170 A | 7/1999 | Oba |
| 5,929,946 A | 7/1999 | Sharp et al. |
| 5,967,637 A | 10/1999 | Ishikawa et al. |
| 5,971,635 A | 10/1999 | Wise |
| 5,995,026 A | 11/1999 | Sellers |
| 5,999,147 A | 12/1999 | Teitel |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A | 3/2000 | Seffernick et al. |
| 6,042,075 A | 3/2000 | Burch, Jr. |
| 6,044,717 A | 4/2000 | Biegelsen et al. |
| 6,046,857 A | 4/2000 | Morishima et al. |
| 6,055,705 A | 5/2000 | Komatsu et al. |
| 6,061,644 A | 5/2000 | Leis |
| 6,072,551 A | 6/2000 | Jannson et al. |
| 6,108,200 A | 8/2000 | Fullerton |
| 6,112,797 A | 9/2000 | Colson et al. |
| 6,124,906 A | 9/2000 | Kawada et al. |
| 6,128,007 A | 10/2000 | Seybold |
| 6,129,444 A | 10/2000 | Tognoni |
| 6,141,388 A | 10/2000 | Servais et al. |
| 6,172,807 B1 | 1/2001 | Akamatsu |
| 6,178,085 B1 | 1/2001 | Leung |
| 6,178,443 B1 | 1/2001 | Lin |
| 6,188,391 B1 | 2/2001 | Seely et al. |
| 6,215,590 B1 | 4/2001 | Okano |
| 6,232,934 B1 | 5/2001 | Heacock et al. |
| 6,254,105 B1 | 7/2001 | Rinde et al. |
| 6,256,447 B1 | 7/2001 | Laine |
| 6,279,060 B1 | 8/2001 | Luke et al. |
| 6,300,986 B1 | 10/2001 | Travis |
| 6,305,073 B1 | 10/2001 | Badders |
| 6,329,617 B1 | 12/2001 | Burgess |
| 6,344,791 B1 | 2/2002 | Armstrong |
| 6,351,273 B1 | 2/2002 | Lemelson et al. |
| 6,353,503 B1 | 3/2002 | Spitzer et al. |
| 6,366,440 B1 | 4/2002 | Kung |
| 6,380,497 B1 | 4/2002 | Hashimoto et al. |
| 6,411,266 B1 | 6/2002 | Maguire, Jr. |
| 6,437,682 B1 | 8/2002 | Vance |
| 6,441,362 B1 | 8/2002 | Ogawa |
| 6,450,046 B1 | 9/2002 | Maeda |
| 6,506,983 B1 | 1/2003 | Babb et al. |
| 6,511,378 B1 | 1/2003 | Bhatt et al. |
| 6,529,179 B1 | 3/2003 | Hashimoto et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,648,485 B1 | 11/2003 | Colgan et al. |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,795,146 B2 | 9/2004 | Dozov et al. |
| 6,798,887 B1 | 9/2004 | Andre |
| 6,813,143 B2 | 11/2004 | Makela |
| 6,819,316 B2 | 11/2004 | Schulz et al. |
| 6,847,488 B2 | 1/2005 | Travis |
| 6,856,506 B2 | 2/2005 | Doherty et al. |
| 6,856,789 B2 | 2/2005 | Pattabiraman et al. |
| 6,861,961 B2 | 3/2005 | Sandbach et al. |
| 6,867,828 B2 | 3/2005 | Taira et al. |
| 6,870,671 B2 | 3/2005 | Travis |
| 6,895,164 B2 | 5/2005 | Saccomanno |
| 6,898,315 B2 | 5/2005 | Guha |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 6,977,643 B2 | 12/2005 | Wilbrink |
| 6,980,177 B2 | 12/2005 | Struyk |
| 6,981,792 B2 | 1/2006 | Nagakubo et al. |
| 7,006,080 B2 | 2/2006 | Gettemy |
| 7,007,238 B2 | 2/2006 | Glaser |
| 7,025,908 B1 | 4/2006 | Hayashi et al. |
| 7,051,149 B2 | 5/2006 | Wang et al. |
| 7,068,496 B2 | 6/2006 | Wong et al. |
| 7,073,933 B2 | 7/2006 | Gotoh et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,101,048 B2 | 9/2006 | Travis |
| 7,104,679 B2 | 9/2006 | Shin et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,129,979 B1 | 10/2006 | Lee |
| 7,136,282 B1 | 11/2006 | Rebeske |
| 7,151,635 B2 | 12/2006 | Bidnyk et al. |
| 7,152,985 B2 | 12/2006 | Benitez et al. |
| 7,153,017 B2 | 12/2006 | Yamashita et al. |
| D535,292 S | 1/2007 | Shi et al. |
| 7,159,132 B2 | 1/2007 | Takahashi et al. |
| 7,194,662 B2 | 3/2007 | Do et al. |
| 7,199,931 B2 | 4/2007 | Boettiger et al. |
| 7,213,323 B2 | 5/2007 | Baker et al. |
| 7,213,991 B2 | 5/2007 | Chapman et al. |
| 7,224,830 B2 | 5/2007 | Nefian et al. |
| 7,252,512 B2 | 8/2007 | Tai et al. |
| 7,260,221 B1 | 8/2007 | Atsmon |
| 7,260,823 B2 | 8/2007 | Schlack et al. |
| 7,277,087 B2 | 10/2007 | Hill et al. |
| 7,280,348 B2 | 10/2007 | Ghosh |
| 7,301,759 B2 | 11/2007 | Hsiung |
| 7,364,343 B2 | 4/2008 | Keuper et al. |
| 7,365,967 B2 | 4/2008 | Zheng |
| 7,370,342 B2 | 5/2008 | Ismail et al. |
| 7,374,312 B2 | 5/2008 | Feng et al. |
| 7,375,885 B2 | 5/2008 | Ijzerman et al. |
| 7,384,178 B2 | 6/2008 | Sumida et al. |
| 7,400,377 B2 | 7/2008 | Evans et al. |
| 7,400,817 B2 | 7/2008 | Lee et al. |
| 7,410,286 B2 | 8/2008 | Travis |
| 7,415,676 B2 | 8/2008 | Fujita |
| 7,431,489 B2 | 10/2008 | Yeo et al. |
| 7,447,922 B1 | 11/2008 | Asbury et al. |
| 7,447,934 B2 | 11/2008 | Dasari et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,499,216 B2 | 3/2009 | Niv et al. |
| 7,502,803 B2 | 3/2009 | Culter et al. |
| 7,503,684 B2 | 3/2009 | Ueno et al. |
| 7,515,143 B2 | 4/2009 | Keam et al. |
| 7,528,374 B2 | 5/2009 | Smitt et al. |
| 7,539,882 B2 | 5/2009 | Jessup et al. |

(56) References Cited

U.S. PATENT DOCUMENTS

| | | |
|---|---|---|
| 7,542,052 B2 | 6/2009 | Solomon et al. |
| 7,545,429 B2 | 6/2009 | Travis |
| 7,558,594 B2 | 7/2009 | Wilson |
| 7,559,834 B1 | 7/2009 | York |
| 7,561,131 B2 | 7/2009 | Ijzerman et al. |
| 7,572,045 B2 | 8/2009 | Hoelen et al. |
| RE40,891 E | 9/2009 | Yasutake |
| 7,594,638 B2 | 9/2009 | Chan et al. |
| 7,620,244 B1 | 11/2009 | Collier |
| 7,631,327 B2 | 12/2009 | Dempski et al. |
| 7,636,921 B2 | 12/2009 | Louie |
| 7,639,329 B2 | 12/2009 | Takeda et al. |
| 7,639,876 B2 | 12/2009 | Clary et al. |
| 7,643,213 B2 | 1/2010 | Boettiger et al. |
| 7,656,392 B2 | 2/2010 | Bolender |
| 7,660,047 B1 | 2/2010 | Travis et al. |
| 7,675,598 B2 | 3/2010 | Hong |
| 7,686,694 B2 | 3/2010 | Cole |
| 7,728,923 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,341 B2 | 8/2010 | Kothandaraman |
| 7,782,342 B2 | 8/2010 | Koh |
| 7,813,715 B2 | 10/2010 | McKillop et al. |
| 7,815,358 B2 | 10/2010 | Inditsky |
| 7,822,338 B2 | 10/2010 | Wernersson |
| 7,844,985 B2 | 11/2010 | Hendricks et al. |
| 7,855,716 B2 | 12/2010 | McCreary et al. |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,918,559 B2 | 4/2011 | Tesar |
| 7,927,654 B2 | 4/2011 | Hagood et al. |
| 7,928,964 B2 | 4/2011 | Kolmykov-Zotov et al. |
| 7,932,890 B2 | 4/2011 | Onikiri et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,957,082 B2 | 6/2011 | Mi et al. |
| 7,965,268 B2 | 6/2011 | Gass et al. |
| 7,967,462 B2 | 6/2011 | Ogiro et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 7,991,257 B1 | 8/2011 | Coleman |
| 8,007,158 B2 | 8/2011 | Woo et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| RE42,992 E | 12/2011 | David |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,102,362 B2 | 1/2012 | Ricks et al. |
| 8,115,499 B2 | 2/2012 | Osoinach et al. |
| 8,115,718 B2 | 2/2012 | Chen et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,149,272 B2 | 4/2012 | Evans et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,421 B2 | 5/2012 | Wright et al. |
| 8,179,236 B2 | 5/2012 | Weller et al. |
| 8,184,190 B2 | 5/2012 | Dosluoglu |
| 8,189,973 B2 | 5/2012 | Travis et al. |
| 8,216,074 B2 | 7/2012 | Sakuma |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,251,563 B2 | 8/2012 | Papakonstantinou et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,310,508 B2 | 11/2012 | Hekstra et al. |
| 8,310,768 B2 | 11/2012 | Lin et al. |
| 8,322,290 B1 | 12/2012 | Mignano |
| 8,325,416 B2 | 12/2012 | Lesage et al. |
| 8,346,206 B1 | 1/2013 | Andrus et al. |
| 8,354,806 B2 | 1/2013 | Adrian et al. |
| 8,362,975 B2 | 1/2013 | Uehara |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,464,079 B2 | 6/2013 | Chueh et al. |
| 8,466,954 B2 | 6/2013 | Ko et al. |
| 8,467,133 B2 | 6/2013 | Miller |
| 8,498,100 B1 | 7/2013 | Whitt, III et al. |
| 8,513,547 B2 | 8/2013 | Ooi |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,565,560 B2 | 10/2013 | Popovich et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,633,898 B2 | 1/2014 | Westerman et al. |
| 8,646,999 B2 | 2/2014 | Shaw et al. |
| 8,674,941 B2 | 3/2014 | Casparian et al. |
| 8,692,212 B1 | 4/2014 | Craft |
| 8,699,215 B2 | 4/2014 | Whitt, III et al. |
| 8,719,603 B2 | 5/2014 | Belesiu et al. |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,791,382 B2 | 7/2014 | Whitt, III et al. |
| 8,797,765 B2 | 8/2014 | Lin et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |

(56) References Cited

U.S. PATENT DOCUMENTS

| | | |
|---|---|---|
| 8,934,221 B2 | 1/2015 | Guo |
| 8,939,422 B2 | 1/2015 | Liu et al. |
| 8,947,353 B2 | 2/2015 | Boulanger et al. |
| 8,947,864 B2 | 2/2015 | Whitt, III et al. |
| 8,949,477 B2 | 2/2015 | Drasnin |
| 8,964,376 B2 | 2/2015 | Chen |
| 9,001,028 B2 | 4/2015 | Baker |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,111,703 B2 | 8/2015 | Whitt, III et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 9,201,185 B2 | 12/2015 | Large |
| 9,256,089 B2 | 2/2016 | Emerton et al. |
| 9,268,373 B2 | 2/2016 | Whitt et al. |
| 2001/0023818 A1 | 9/2001 | Masaru et al. |
| 2002/0005108 A1 | 1/2002 | Ludwig |
| 2002/0008854 A1 | 1/2002 | Travis et al. |
| 2002/0044216 A1 | 4/2002 | Cha |
| 2002/0070883 A1 | 6/2002 | Dosch |
| 2002/0134828 A1 | 9/2002 | Sandbach et al. |
| 2002/0135457 A1 | 9/2002 | Sandbach et al. |
| 2002/0163510 A1 | 11/2002 | Williams et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0009518 A1 | 1/2003 | Harrow et al. |
| 2003/0011576 A1 | 1/2003 | Sandbach et al. |
| 2003/0016282 A1 | 1/2003 | Koizumi |
| 2003/0028688 A1 | 2/2003 | Tiphane et al. |
| 2003/0036365 A1 | 2/2003 | Kuroda |
| 2003/0044216 A1 | 3/2003 | Fang |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0132916 A1 | 7/2003 | Kramer |
| 2003/0137821 A1 | 7/2003 | Gotoh et al. |
| 2003/0160712 A1 | 8/2003 | Levy |
| 2003/0163611 A1 | 8/2003 | Nagao |
| 2003/0165017 A1 | 9/2003 | Amitai |
| 2003/0173195 A1 | 9/2003 | Federspiel |
| 2003/0197687 A1 | 10/2003 | Shetter |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0100457 A1 | 5/2004 | Mandle |
| 2004/0113956 A1 | 6/2004 | Bellwood et al. |
| 2004/0160734 A1 | 8/2004 | Yim |
| 2004/0169641 A1 | 9/2004 | Bean et al. |
| 2004/0212553 A1 | 10/2004 | Wang et al. |
| 2004/0212598 A1 | 10/2004 | Kraus et al. |
| 2004/0212601 A1 | 10/2004 | Cake et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2005/0285703 A1 | 12/2005 | Wheeler et al. |
| 2006/0010400 A1 | 1/2006 | Dehlin et al. |
| 2006/0012767 A1 | 1/2006 | Komatsuda et al. |
| 2006/0028400 A1 | 2/2006 | Lapstun et al. |
| 2006/0028476 A1 | 2/2006 | Sobel |
| 2006/0028838 A1 | 2/2006 | Imade |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0083004 A1 | 4/2006 | Cok |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102020 A1 | 5/2006 | Takada et al. |
| 2006/0102914 A1 | 5/2006 | Smits et al. |
| 2006/0125799 A1 | 6/2006 | Hillis et al. |
| 2006/0132423 A1 | 6/2006 | Travis |
| 2006/0146573 A1 | 7/2006 | Iwauchi et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0215244 A1 | 9/2006 | Yosha et al. |
| 2006/0220465 A1 | 10/2006 | Kingsmore et al. |
| 2006/0227393 A1 | 10/2006 | Herloski |
| 2006/0238510 A1 | 10/2006 | Panotopoulos et al. |
| 2006/0238550 A1 | 10/2006 | Page |
| 2006/0250381 A1 | 11/2006 | Geaghan |
| 2006/0262185 A1 | 11/2006 | Cha et al. |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2006/0279501 A1 | 12/2006 | Lu et al. |
| 2007/0003267 A1 | 1/2007 | Shibutani |
| 2007/0019181 A1 | 1/2007 | Sinclair et al. |
| 2007/0046625 A1 | 3/2007 | Yee |
| 2007/0047221 A1 | 3/2007 | Park |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0076434 A1 | 4/2007 | Uehara et al. |
| 2007/0080813 A1 | 4/2007 | Melvin |
| 2007/0081091 A1 | 4/2007 | Pan et al. |
| 2007/0091638 A1 | 4/2007 | Ijzerman et al. |
| 2007/0117600 A1 | 5/2007 | Robertson et al. |
| 2007/0121956 A1 | 5/2007 | Bai et al. |
| 2007/0122027 A1 | 5/2007 | Kunita et al. |
| 2007/0127205 A1 | 6/2007 | Kuo |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0200830 A1 | 8/2007 | Yamamoto |
| 2007/0201246 A1 | 8/2007 | Yeo et al. |
| 2007/0201859 A1 | 8/2007 | Sarrat |
| 2007/0217224 A1 | 9/2007 | Kao et al. |
| 2007/0220708 A1 | 9/2007 | Lewis |
| 2007/0222766 A1 | 9/2007 | Bolender |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247338 A1 | 10/2007 | Marchetto |
| 2007/0247432 A1 | 10/2007 | Oakley |
| 2007/0252674 A1 | 11/2007 | Nelson et al. |
| 2007/0260892 A1 | 11/2007 | Paul et al. |
| 2007/0274094 A1 | 11/2007 | Schultz et al. |

(56) References Cited

U.S. PATENT DOCUMENTS

| | | |
|---|---|---|
| 2007/0274095 A1 | 11/2007 | Destain |
| 2007/0274099 A1 | 11/2007 | Tai et al. |
| 2007/0283179 A1 | 12/2007 | Burnett et al. |
| 2007/0296709 A1 | 12/2007 | Guanghai |
| 2007/0297625 A1 | 12/2007 | Hjort et al. |
| 2008/0005423 A1 | 1/2008 | Jacobs et al. |
| 2008/0013809 A1 | 1/2008 | Zhu et al. |
| 2008/0019150 A1 | 1/2008 | Park et al. |
| 2008/0037284 A1 | 2/2008 | Rudisill |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0074398 A1 | 3/2008 | Wright |
| 2008/0104437 A1 | 5/2008 | Lee |
| 2008/0106592 A1 | 5/2008 | Mikami |
| 2008/0122803 A1 | 5/2008 | Izadi et al. |
| 2008/0129520 A1 | 6/2008 | Lee |
| 2008/0150913 A1 | 6/2008 | Bell et al. |
| 2008/0151478 A1 | 6/2008 | Chern |
| 2008/0158185 A1 | 7/2008 | Westerman |
| 2008/0167832 A1 | 7/2008 | Soss |
| 2008/0174570 A1 | 7/2008 | Jobs et al. |
| 2008/0180411 A1 | 7/2008 | Solomon et al. |
| 2008/0186660 A1 | 8/2008 | Yang |
| 2008/0211787 A1 | 9/2008 | Nakao et al. |
| 2008/0219025 A1 | 9/2008 | Spitzer et al. |
| 2008/0225205 A1 | 9/2008 | Travis |
| 2008/0228969 A1 | 9/2008 | Cheah et al. |
| 2008/0238884 A1 | 10/2008 | Harish |
| 2008/0253822 A1 | 10/2008 | Matias |
| 2008/0297878 A1 | 12/2008 | Brown et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0316768 A1 | 12/2008 | Travis |
| 2008/0320190 A1 | 12/2008 | Lydon et al. |
| 2009/0007001 A1 | 1/2009 | Morin et al. |
| 2009/0009476 A1 | 1/2009 | Daley, III |
| 2009/0033623 A1 | 2/2009 | Lin |
| 2009/0040426 A1 | 2/2009 | Mather et al. |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0083710 A1 | 3/2009 | Best et al. |
| 2009/0089600 A1 | 4/2009 | Nousiainen |
| 2009/0096738 A1 | 4/2009 | Chen et al. |
| 2009/0096756 A1 | 4/2009 | Lube |
| 2009/0102805 A1 | 4/2009 | Meijer et al. |
| 2009/0127005 A1 | 5/2009 | Zachut et al. |
| 2009/0131134 A1* | 5/2009 | Baerlocher et al. ............. 463/13 |
| 2009/0135318 A1 | 5/2009 | Tateuchi et al. |
| 2009/0140985 A1 | 6/2009 | Liu |
| 2009/0146975 A1 | 6/2009 | Chang |
| 2009/0146992 A1 | 6/2009 | Fukunaga et al. |
| 2009/0152748 A1 | 6/2009 | Wang et al. |
| 2009/0158221 A1* | 6/2009 | Nielsen et al. ................. 715/867 |
| 2009/0161385 A1 | 6/2009 | Parker et al. |
| 2009/0163147 A1 | 6/2009 | Steigerwald et al. |
| 2009/0167728 A1 | 7/2009 | Geaghan et al. |
| 2009/0167930 A1 | 7/2009 | Safaee-Rad et al. |
| 2009/0174687 A1 | 7/2009 | Ciesla et al. |
| 2009/0174759 A1 | 7/2009 | Yeh et al. |
| 2009/0177906 A1 | 7/2009 | Paniagua, Jr. et al. |
| 2009/0189873 A1 | 7/2009 | Peterson |
| 2009/0189974 A1 | 7/2009 | Deering |
| 2009/0195497 A1 | 8/2009 | Fitzgerald et al. |
| 2009/0195518 A1 | 8/2009 | Mattice et al. |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244009 A1 | 10/2009 | Staats et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0251623 A1 | 10/2009 | Koyama |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0269943 A1 | 10/2009 | Palli et al. |
| 2009/0276734 A1 | 11/2009 | Taylor et al. |
| 2009/0285491 A1 | 11/2009 | Ravenscroft et al. |
| 2009/0296331 A1 | 12/2009 | Choy |
| 2009/0303137 A1 | 12/2009 | Kusaka et al. |
| 2009/0303204 A1 | 12/2009 | Nasiri et al. |
| 2009/0315830 A1 | 12/2009 | Westerman |
| 2009/0316072 A1 | 12/2009 | Okumura et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0006412 A1 | 1/2010 | Wang et al. |
| 2010/0013319 A1 | 1/2010 | Kamiyama et al. |
| 2010/0013738 A1 | 1/2010 | Covannon et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0053771 A1 | 3/2010 | Travis et al. |
| 2010/0054435 A1 | 3/2010 | Louch et al. |
| 2010/0056130 A1 | 3/2010 | Louch et al. |
| 2010/0072351 A1 | 3/2010 | Mahowald |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0079861 A1 | 4/2010 | Powell |
| 2010/0081377 A1 | 4/2010 | Chatterjee et al. |
| 2010/0083108 A1* | 4/2010 | Rider et al. .................... 715/702 |
| 2010/0085321 A1 | 4/2010 | Pundsack |
| 2010/0100752 A1 | 4/2010 | Chueh et al. |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0103611 A1 | 4/2010 | Yang et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1* | 5/2010 | Kent ............................ 345/177 |
| 2010/0123686 A1 | 5/2010 | Klinghult et al. |
| 2010/0128427 A1 | 5/2010 | Iso |
| 2010/0133398 A1 | 6/2010 | Chiu et al. |
| 2010/0135036 A1 | 6/2010 | Matsuba et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149073 A1 | 6/2010 | Chaum et al. |
| 2010/0149104 A1 | 6/2010 | Sim et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0156798 A1 | 6/2010 | Archer |
| 2010/0156913 A1 | 6/2010 | Ortega et al. |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0185877 A1 | 7/2010 | Chueh et al. |
| 2010/0188299 A1 | 7/2010 | Rinehart et al. |
| 2010/0188338 A1 | 7/2010 | Longe |
| 2010/0201308 A1 | 8/2010 | Lindholm |
| 2010/0205472 A1 | 8/2010 | Tupman et al. |
| 2010/0206614 A1 | 8/2010 | Park et al. |

(56) References Cited

U.S. PATENT DOCUMENTS

| | | |
|---|---|---|
| 2010/0206644 A1 | 8/2010 | Yeh |
| 2010/0207774 A1 | 8/2010 | Song |
| 2010/0214214 A1 | 8/2010 | Corson et al. |
| 2010/0214257 A1 | 8/2010 | Wussler et al. |
| 2010/0220205 A1 | 9/2010 | Lee et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0238075 A1 | 9/2010 | Pourseyed |
| 2010/0238138 A1 | 9/2010 | Goertz et al. |
| 2010/0238620 A1 | 9/2010 | Fish |
| 2010/0245221 A1 | 9/2010 | Khan |
| 2010/0245289 A1 | 9/2010 | Svajda |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0289457 A1 | 11/2010 | Onnerud et al. |
| 2010/0295812 A1 | 11/2010 | Burns et al. |
| 2010/0296163 A1 | 11/2010 | Saarikko |
| 2010/0299642 A1 | 11/2010 | Merrell et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315345 A1 | 12/2010 | Laitinen |
| 2010/0315348 A1 | 12/2010 | Jellicoe et al. |
| 2010/0315373 A1 | 12/2010 | Steinhauser et al. |
| 2010/0321339 A1 | 12/2010 | Kimmel |
| 2010/0321482 A1 | 12/2010 | Cleveland |
| 2010/0321877 A1 | 12/2010 | Moser |
| 2010/0322479 A1 | 12/2010 | Cleveland |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0007047 A1 | 1/2011 | Fujioka et al. |
| 2011/0012873 A1 | 1/2011 | Prest et al. |
| 2011/0018799 A1 | 1/2011 | Lin |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0032215 A1 | 2/2011 | Sirotich et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0044582 A1 | 2/2011 | Travis et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0072391 A1 | 3/2011 | Hanggie et al. |
| 2011/0074688 A1 | 3/2011 | Hull et al. |
| 2011/0075440 A1 | 3/2011 | Wang |
| 2011/0081946 A1 | 4/2011 | Singh et al. |
| 2011/0096035 A1 | 4/2011 | Shen |
| 2011/0102326 A1 | 5/2011 | Casparian et al. |
| 2011/0102356 A1 | 5/2011 | Kemppinen et al. |
| 2011/0102752 A1 | 5/2011 | Chen et al. |
| 2011/0107958 A1 | 5/2011 | Pance et al. |
| 2011/0108401 A1 | 5/2011 | Yamada et al. |
| 2011/0113368 A1 | 5/2011 | Carvajal et al. |
| 2011/0115738 A1 | 5/2011 | Suzuki et al. |
| 2011/0115747 A1 | 5/2011 | Powell et al. |
| 2011/0117970 A1 | 5/2011 | Choi |
| 2011/0118025 A1 | 5/2011 | Lukas et al. |
| 2011/0122071 A1 | 5/2011 | Powell |
| 2011/0134032 A1 | 6/2011 | Chiu et al. |
| 2011/0134043 A1 | 6/2011 | Chen |
| 2011/0134112 A1 | 6/2011 | Koh et al. |
| 2011/0157037 A1 | 6/2011 | Shamir et al. |
| 2011/0157046 A1 | 6/2011 | Lee et al. |
| 2011/0157087 A1 | 6/2011 | Kanehira et al. |
| 2011/0157101 A1 | 6/2011 | Chang |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0169778 A1 | 7/2011 | Nungester et al. |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0184646 A1 | 7/2011 | Wong et al. |
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0193938 A1 | 8/2011 | Oderwald et al. |
| 2011/0199389 A1 * | 8/2011 | Lu et al. ............ 345/619 |
| 2011/0202878 A1 | 8/2011 | Park et al. |
| 2011/0205372 A1 | 8/2011 | Miramontes |
| 2011/0216266 A1 | 9/2011 | Travis |
| 2011/0221659 A1 | 9/2011 | King et al. |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0234494 A1 | 9/2011 | Peterson et al. |
| 2011/0234502 A1 | 9/2011 | Yun et al. |
| 2011/0235179 A1 | 9/2011 | Simmonds |
| 2011/0241999 A1 | 10/2011 | Thier |
| 2011/0242063 A1 | 10/2011 | Li et al. |
| 2011/0242138 A1 | 10/2011 | Tribble |
| 2011/0242298 A1 | 10/2011 | Bathiche et al. |
| 2011/0242440 A1 | 10/2011 | Noma et al. |
| 2011/0242670 A1 | 10/2011 | Simmonds |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0262001 A1 | 10/2011 | Bi et al. |
| 2011/0265287 A1 | 11/2011 | Li et al. |
| 2011/0266672 A1 | 11/2011 | Sylvester |
| 2011/0273475 A1 | 11/2011 | Herz et al. |
| 2011/0285555 A1 | 11/2011 | Bocirnea |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0304815 A1 | 12/2011 | Newell |
| 2011/0305875 A1 | 12/2011 | Sanford et al. |
| 2011/0306424 A1 | 12/2011 | Kazama et al. |
| 2011/0314425 A1 | 12/2011 | Chiang |
| 2011/0316807 A1 | 12/2011 | Corrion |
| 2011/0320204 A1 | 12/2011 | Locker et al. |
| 2012/0002820 A1 | 1/2012 | Leichter |
| 2012/0007821 A1 | 1/2012 | Zaliva |
| 2012/0011462 A1 | 1/2012 | Westerman et al. |
| 2012/0013519 A1 | 1/2012 | Hakansson et al. |
| 2012/0019165 A1 | 1/2012 | Igaki et al. |
| 2012/0020112 A1 | 1/2012 | Fisher et al. |
| 2012/0020490 A1 | 1/2012 | Leichter |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0026096 A1 | 2/2012 | Ku |

(56) References Cited

U.S. PATENT DOCUMENTS

| | | |
|---|---|---|
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0038495 A1 | 2/2012 | Ishikawa |
| 2012/0044140 A1 | 2/2012 | Koyama et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0062850 A1 | 3/2012 | Travis |
| 2012/0068919 A1 | 3/2012 | Lauder et al. |
| 2012/0069540 A1 | 3/2012 | Lauder et al. |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0103778 A1 | 5/2012 | Obata et al. |
| 2012/0105321 A1 | 5/2012 | Wang et al. |
| 2012/0113137 A1 | 5/2012 | Nomoto |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0127126 A1* | 5/2012 | Mattice et al. ............... 345/174 |
| 2012/0127573 A1 | 5/2012 | Robinson et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0156875 A1 | 6/2012 | Srinivas et al. |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0188791 A1 | 7/2012 | Voloschenko et al. |
| 2012/0194393 A1 | 8/2012 | Utterman et al. |
| 2012/0194448 A1 | 8/2012 | Rothkopf |
| 2012/0195063 A1 | 8/2012 | Kim et al. |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Ayala et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0242584 A1 | 9/2012 | Tuli |
| 2012/0243165 A1 | 9/2012 | Chang et al. |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1* | 10/2012 | Dodge ............... G06F 3/04812 345/157 |
| 2012/0256959 A1 | 10/2012 | Ye et al. |
| 2012/0260177 A1 | 10/2012 | Sehrer |
| 2012/0274811 A1 | 11/2012 | Bakin |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2013/0009413 A1 | 1/2013 | Chiu et al. |
| 2013/0015311 A1 | 1/2013 | Kim |
| 2013/0016468 A1 | 1/2013 | Oh |
| 2013/0021289 A1* | 1/2013 | Chen et al. .................. 345/174 |
| 2013/0027356 A1 | 1/2013 | Nishida |
| 2013/0027867 A1 | 1/2013 | Lauder et al. |
| 2013/0031353 A1 | 1/2013 | Noro |
| 2013/0038541 A1 | 2/2013 | Bakker |
| 2013/0044059 A1 | 2/2013 | Fu |
| 2013/0044074 A1 | 2/2013 | Park et al. |
| 2013/0046397 A1* | 2/2013 | Fadell et al. ................... 700/83 |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076617 A1 | 3/2013 | Csaszar et al. |
| 2013/0076635 A1 | 3/2013 | Lin |
| 2013/0082824 A1 | 4/2013 | Colley |
| 2013/0088431 A1 | 4/2013 | Ballagas et al. |
| 2013/0100030 A1 | 4/2013 | Los et al. |
| 2013/0100082 A1* | 4/2013 | Bakin et al. .................. 345/175 |
| 2013/0106766 A1 | 5/2013 | Yilmaz et al. |
| 2013/0107144 A1 | 5/2013 | Marhefka et al. |
| 2013/0120466 A1 | 5/2013 | Chen et al. |
| 2013/0127980 A1 | 5/2013 | Haddik et al. |
| 2013/0135214 A1 | 5/2013 | Li et al. |
| 2013/0154959 A1* | 6/2013 | Lindsay ................ G06F 1/1694 345/173 |
| 2013/0155723 A1 | 6/2013 | Coleman |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0182246 A1 | 7/2013 | Tanase |
| 2013/0191741 A1 | 7/2013 | Dickinson et al. |
| 2013/0201094 A1 | 8/2013 | Travis |
| 2013/0207937 A1 | 8/2013 | Lutian et al. |
| 2013/0212483 A1* | 8/2013 | Brakensiek et al. .......... 715/740 |
| 2013/0215035 A1 | 8/2013 | Guard |
| 2013/0217451 A1 | 8/2013 | Komiyama et al. |
| 2013/0222272 A1* | 8/2013 | Martin, Jr. .......... G06F 3/04886 345/173 |
| 2013/0222274 A1* | 8/2013 | Mori ................. B60K 37/06 345/173 |
| 2013/0222275 A1 | 8/2013 | Byrd et al. |
| 2013/0222323 A1* | 8/2013 | McKenzie ............. G06F 1/169 345/174 |
| 2013/0222353 A1 | 8/2013 | Large |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229351 A1 | 9/2013 | Whitt, III |
| 2013/0229354 A1 | 9/2013 | Whitt, III et al. |
| 2013/0229356 A1 | 9/2013 | Marwah |
| 2013/0229357 A1 | 9/2013 | Powell |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |

(56) References Cited

U.S. PATENT DOCUMENTS

| | | |
|---|---|---|
| 2013/0262886 A1 | 10/2013 | Nishimura |
| 2013/0268897 A1 | 10/2013 | Li et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0308339 A1 | 11/2013 | Woodgate et al. |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0339757 A1 | 12/2013 | Reddy |
| 2013/0342976 A1 | 12/2013 | Chung |
| 2014/0012401 A1 | 1/2014 | Perek |
| 2014/0048399 A1 | 2/2014 | Whitt, III |
| 2014/0063198 A1 | 3/2014 | Boulanger |
| 2014/0085814 A1 | 3/2014 | Kielland |
| 2014/0119802 A1 | 5/2014 | Shaw |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0362506 A1 | 12/2014 | Whitt, III et al. |
| 2014/0372914 A1* | 12/2014 | Byrd et al. ............ 715/760 |
| 2014/0379942 A1 | 12/2014 | Perek et al. |
| 2015/0005953 A1* | 1/2015 | Fadell et al. ............ 700/276 |
| 2015/0036274 A1 | 2/2015 | Belesui et al. |
| 2015/0261262 A1 | 9/2015 | Whitt, III et al. |
| 2015/0311014 A1 | 10/2015 | Shaw et al. |
| 2015/0378392 A1 | 12/2015 | Siddiqui et al. |

FOREIGN PATENT DOCUMENTS

| | | |
|---|---|---|
| CN | 1440513 | 9/2003 |
| CN | 1515937 | 7/2004 |
| CN | 1537223 | 10/2004 |
| CN | 1650202 | 8/2005 |
| CN | 1653411 | 8/2005 |
| CN | 1700072 | 11/2005 |
| CN | 1787605 | 6/2006 |
| CN | 1808362 | 7/2006 |
| CN | 1920642 | 2/2007 |
| CN | 101038401 | 9/2007 |
| CN | 101198925 | 6/2008 |
| CN | 101366001 | 2/2009 |
| CN | 101410781 | 4/2009 |
| CN | 101452334 | 6/2009 |
| CN | 101464750 | 6/2009 |
| CN | 101473167 | 7/2009 |
| CN | 101490642 | 7/2009 |
| CN | 101500388 | 8/2009 |
| CN | 101512403 | 8/2009 |
| CN | 101644979 | 2/2010 |
| CN | 101675406 | 3/2010 |
| CN | 101681189 | 3/2010 |
| CN | 101688991 | 3/2010 |
| CN | 101889225 | 11/2010 |
| CN | 101893785 | 11/2010 |
| CN | 101908428 | 12/2010 |
| CN | 102004559 | 4/2011 |
| CN | 1102012763 | 4/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102214040 | 10/2011 |
| CN | 102292687 | 12/2011 |
| CN | 102356624 | 2/2012 |
| CN | 103455149 | 12/2013 |
| DE | 10116556 | 10/2002 |
| EP | 645726 | 3/1995 |
| EP | 1003188 | 5/2000 |
| EP | 1223722 | 7/2002 |
| EP | 1480029 | 11/2004 |
| EP | 1591891 | 11/2005 |
| EP | 1983411 | 10/2008 |
| EP | 2006869 | 12/2008 |
| EP | 2026178 | 2/2009 |
| EP | 2353978 | 8/2011 |
| EP | 2381290 | 10/2011 |
| EP | 2410408 | 1/2012 |
| GB | 2068643 | 8/1981 |
| GB | 2178570 | 2/1987 |
| GB | 2305780 | 4/1997 |
| GB | 2381584 | 5/2003 |
| GB | 2402460 | 12/2004 |
| GB | 2410116 | 7/2005 |
| GB | 2428101 | 1/2007 |
| GB | 2482932 | 2/2012 |
| JP | 52107722 | 9/1977 |
| JP | H07218865 | 8/1995 |
| JP | H0980354 | 3/1997 |
| JP | H09178949 | 7/1997 |
| JP | H10234057 | 9/1998 |
| JP | 10301055 | 11/1998 |
| JP | 10326124 | 12/1998 |
| JP | 1173239 | 3/1999 |
| JP | 11338575 | 12/1999 |
| JP | 2000010654 | 1/2000 |
| JP | 2000106021 | 4/2000 |
| JP | 2001142564 | 5/2001 |
| JP | 2001174746 | 6/2001 |
| JP | 2002100226 | 4/2002 |
| JP | 2002162912 | 6/2002 |
| JP | 2002170458 | 6/2002 |
| JP | 2003215349 | 7/2003 |
| JP | 2004038950 | 2/2004 |
| JP | 2004171948 | 6/2004 |
| JP | 2005077437 | 3/2005 |
| JP | 2005156932 | 5/2005 |
| JP | 2005331565 | 12/2005 |
| JP | 2006004877 | 1/2006 |
| JP | 2006163459 | 6/2006 |
| JP | 2006278251 | 10/2006 |
| JP | 2006294361 | 10/2006 |
| JP | 2006310269 | 11/2006 |
| JP | 2007184286 | 7/2007 |
| JP | 2007273288 | 10/2007 |
| JP | 2008066152 | 3/2008 |
| JP | 2008286874 | 7/2008 |
| JP | 2008529251 | 7/2008 |
| JP | 2009059583 | 3/2009 |
| JP | 2009122551 | 6/2009 |
| JP | 2010151951 | 7/2010 |
| JP | 2010244514 | 10/2010 |
| JP | 2003077368 | 3/2014 |
| KR | 20010039013 | 5/2001 |
| KR | 20010107055 | 12/2001 |
| KR | 20050014299 | 2/2005 |
| KR | 20060003093 | 1/2006 |
| KR | 20080006404 | 1/2008 |
| KR | 20080009490 | 1/2008 |
| KR | 20080055051 | 6/2008 |
| KR | 20090029411 | 3/2009 |
| KR | 20100022059 | 2/2010 |
| KR | 20100067366 | 6/2010 |
| KR | 20100115675 | 10/2010 |
| KR | 20110064265 | 6/2011 |
| KR | 1020110087178 | 8/2011 |
| KR | 20110109791 | 10/2011 |
| KR | 20110120002 | 11/2011 |
| KR | 20110122333 | 11/2011 |
| KR | 101113530 | 2/2012 |
| NL | 1038411 | 5/2012 |

(56) References Cited

FOREIGN PATENT DOCUMENTS

| WO | WO-9919995 | 4/1999 |
|---|---|---|
| WO | WO-9964784 | 12/1999 |
| WO | WO-0079327 | 12/2000 |
| WO | WO-0128309 | 4/2001 |
| WO | WO-0172037 | 9/2001 |
| WO | WO-03048635 | 6/2003 |
| WO | WO-03083530 | 9/2003 |
| WO | WO-2005059874 | 6/2005 |
| WO | WO-2006044818 | 4/2006 |
| WO | WO-2006082444 | 8/2006 |
| WO | WO-2007094304 | 8/2007 |
| WO | WO-2007103631 | 9/2007 |
| WO | WO-2007112172 | 10/2007 |
| WO | WO-2007123202 | 11/2007 |
| WO | WO-2008013146 | 1/2008 |
| WO | WO-2008038016 | 4/2008 |
| WO | WO-2009034484 | 3/2009 |
| WO | WO-2010011983 | 1/2010 |
| WO | WO-2010074116 | 7/2010 |
| WO | WO-2011049609 | 4/2011 |
| WO | WO-2013033274 | 3/2013 |
| WO | WO-2013163347 | 10/2013 |

OTHER PUBLICATIONS

Xu, Zhang et al., "Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hand%20Gesture%20Recognition%20and-%20Virtual%20Game%20Control%20based%20on%203d%20-accelerometer%20and%20EMG%20sensors.pdf> on Jan. 5, 2012,(Feb. 8, 2009), 5 pages.

Xu, Zhi-Gang et al., "Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012,(Dec. 5, 2009), pp. 223-226.

Yagi, Nobuyuki "The Concept of "AdapTV"", *Series: The Challenge of "AdapTV", Broadcast Technology*, No. 28, (2006), pp. 16-17.

Yan, Jin-Ren et al., "Edge-Lighting Light Guide Plate Based on Micro-Prism for Liquid Crystal Display", *Journal of Display Technology*, vol. 5, No. 9, Available at <http://ieeexplore.ieee.org/ielx5/9425/5196834/05196835.pdf?tp=&arnumber=5196835&isnumber=5196834>,(Sep. 2009), pp. 355-357.

Yu, et al., "A New Driving Scheme for Reflective Bistable Cholesteric Liquid Crystal Displays", *Society for Information Display International Symposium Digest of Technical Papers*, Retrieved from <http://www.ee.ust.hk/~eekwok/publications/1997/bcd_sid.pdf>,(May 1997), 4 pages.

Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.

Zhang, Rui "Design of Head Mounted Displays", Retrieved at <<http://www.optics.arizona.edu/optomech/student%20reports/2007/Design%20of%20mounteddisplays%20Zhang.pdf>>, (Dec. 12, 2007), 6 pages.

Zhu, Dingyun et al., "Keyboard before Head Tracking Depresses User Success in Remote Camera Control", *In Proceedings of the 12th IFIP TC 13 International Conference on Human-Computer Interaction, Part II*, retrieved from <http://csiro.academia.edu/Departmemts/CSIRO_ICT_Centre/Papers?page=5> on Jun. 1, 2012,(Aug. 24, 2009), 14 pages.

"Advisory Action", U.S. Appl. No. 14/199,924, May 28, 2014, 2 pages.

"Corrected Notice of Allowance", U.S. Appl. No. 13/938,930, Jun. 6, 2014, 2 pages.

"Corrected Notice of Allowance", U.S. Appl. No. 13/939,002, May 22, 2014, 2 pages.

"Corrected Notice of Allowance", U.S. Appl. No. 13/939,002, Jun. 19, 2014, 2 pages.

"Corrected Notice of Allowance", U.S. Appl. No. 13/939,032, Jun. 26, 2014, 2 pages.

"Final Office Action", U.S. Appl. No. 13/494,651, Jun. 11, 2014, 19 pages.

"Final Office Action", U.S. Appl. No. 13/653,682, Jun. 11, 2014, 11 pages.

"Foreign Notice of Allowance", CN Application No. 201320096755.7, Jan. 27, 2014, 2 pages.

"Foreign Office Action", CN Application No. 201320097079.5, Sep. 26, 2013, 4 pages.

"Interlink Electronics FSR (TM) Force Sensing Resistors (TM)", Retrieved at <<http://akizukidenshi.com/download/ds/interlinkelec/94-00004+Rev+B%20FSR%20Integration%20Guide.pdf on Mar. 21, 2013, 36 pages.

"International Search Report and Written Opinion", Application No. PCT/US2014/031531, Jun. 20, 2014, 10 Pages.

"Non-Final Office Action", U.S. Appl. No. 13/468,882, Jul. 9, 2014, 9 pages.

"Non-Final Office Action", U.S. Appl. No. 13/468,949, Jun. 20, 2014, 10 pages.

"Non-Final Office Action", U.S. Appl. No. 13/470,951, Jul. 2, 2014, 19 pages.

"Non-Final Office Action", U.S. Appl. No. 13/471,001, Jun. 17, 2014, 23 pages.

"Non-Final Office Action", U.S. Appl. No. 13/471,030, May 15, 2014, 10 pages.

"Non-Final Office Action", U.S. Appl. No. 13/471,054, Jun. 3, 2014, 15 pages.

"Non-Final Office Action", U.S. Appl. No. 13/471,412, Jul. 11, 2014, 22 pages.

"Non-Final Office Action", U.S. Appl. No. 13/564,520, Jun. 16, 2014, 5 pages.

"Non-Final Office Action", U.S. Appl. No. 13/595,700, Jun. 18, 2014, 8 pages.

"Non-Final Office Action", U.S. Appl. No. 13/647,479, Jul. 3, 2014, 10 pages.

"Non-Final Office Action", U.S. Appl. No. 13/651,976, Jun. 16, 2014, 23 pages.

"Non-Final Office Action", U.S. Appl. No. 14/225,250, Jun. 17, 2014, 5 pages.

"Non-Final Office Action", U.S. Appl. No. 14/225,276, Jun. 13, 2014, 6 pages.

"Non-Final Office Action", U.S. Appl. No. 14/277,240, Jun. 13, 2014, 6 pages.

"Notice of Allowance", U.S. Appl. No. 13/468,918, Jun. 17, 2014, 5 pages.

"Notice of Allowance", U.S. Appl. No. 13/471,186, Jul. 3, 2014, 7 pages.

"Notice of Allowance", U.S. Appl. No. 13/471,237, May 12, 2014, 8 pages.

"Notice of Allowance", U.S. Appl. No. 13/471,405, Jun. 24, 2014, 9 pages.

"Notice of Allowance", U.S. Appl. No. 14/018,286, May 23, 2014, 8 pages.

"Notice of Allowance", U.S. Appl. No. 14/199,924, Jun. 10, 2014, 4 pages.

"Restriction Requirement", U.S. Appl. No. 13/595,700, May 28, 2014, 6 pages.

"Supplemental Notice of Allowance", U.S. Appl. No. 14/018,286, Jun. 11, 2014, 5 pages.

"Corrected Notice of Allowance", U.S. Appl. No. 13/563,435, Mar. 20, 2014, 2 pages.

"Corrected Notice of Allowance", U.S. Appl. No. 13/565,124, Apr. 3, 2014, 4 pages.

"Corrected Notice of Allowance", U.S. Appl. No. 13/565,124, Mar. 10, 2014, 2 pages.

"Corrected Notice of Allowance", U.S. Appl. No. 13/565,124, Apr. 14, 2014, 2 pages.

"Corrected Notice of Allowance", U.S. Appl. No. 13/938,930, May 6, 2014, 2 pages.

"Corrected Notice of Allowance", U.S. Appl. No. 13/939,002, May 5, 2014, 2 pages.

(56) References Cited

OTHER PUBLICATIONS

"Final Office Action", U.S. Appl. No. 13/371,725, Apr. 2, 2014, 22 pages.
"Final Office Action", U.S. Appl. No. 13/525,070, Apr. 24, 2014, 21 pages.
"Final Office Action", U.S. Appl. No. 13/780,228, Mar. 28, 2014, 13 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Non-Final Office Action", U.S. Appl. No. 13/471,186, Feb. 27, 2014, 8 pages.
"Non-Final Office Action", U.S. Appl. No. 13/471,237, Mar. 24, 2014, 7 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/492,232, Apr. 30, 2014, 9 pages.
"Non-Final Office Action", U.S. Appl. No. 13/527,263, Apr. 3, 2014, 6 pages.
"Non-Final Office Action", U.S. Appl. No. 13/653,682, Feb. 26, 2014, 10 pages.
"Non-Final Office Action", U.S. Appl. No. 13/656,055, Mar. 12, 2014, 17 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 13/471,139, Mar. 17, 2014, 4 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Corrected Notice of Allowance", U.S. Appl. No. 13/471,030, Sep. 30, 2014, 2 pages.
"Corrected Notice of Allowance", U.S. Appl. No. 13/651,287, Aug. 21, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"EP Search Report", EP Application No. 09812072.8, Apr. 5, 2012, 6 Pages.
"Final Office Action", U.S. Appl. No. 13/468,949, Oct. 6, 2014, 11 pages.
"Final Office Action", U.S. Appl. No. 13/471,336, Oct. 6, 2014, 13 pages.
"Final Office Action", U.S. Appl. No. 13/595,700, Oct. 9, 2014, 8 pages.
"Final Office Action", U.S. Appl. No. 13/656,055, Sep. 17, 2014, 10 pages.
"Foreign Notice of Allowance", CN Application No. 201320097065.3, Nov. 21, 2013, 2 pages.
"Foreign Office Action", CN Application No. 200980134848, May 13, 2013, 7 Pages.
"Foreign Office Action", CN Application No. 200980134848, May 31, 2012, 7 Pages.
"Foreign Office Action", CN Application No. 200980134848, Dec. 4, 2013, 8 Pages.
"Foreign Office Action", CN Application No. 200980134848, Dec. 19, 2012, 8 Pages.
"Foreign Office Action", CN Application No. 201080037117.7, Jul. 1, 2014, 9 Pages.
"Foreign Office Action", CN Application No. 201210023945.6, Jun. 25, 2014, 6 Pages.
"Foreign Office Action", CN Application No. 201320097065.3, Jun. 18, 2013, 2 pages.
"Foreign Office Action", JP Application No. 2011-526118, Aug. 16, 2013, 8 Pages.
"Foreign Office Action", JP Application No. 2012-525632, May 2, 2014, 10 Pages.
"Foreign Office Action", JP Application No. 2012-525722, Apr. 22, 2014, 15 pages.
"International Search Report and Written Opinion", Application No. PCT/US2009/055250, Mar. 2, 2014, 10 Pages.
"Non-Final Office Action", U.S. Appl. No. 13/021,448, Jul. 22, 2014, 35 pages.
"Non-Final Office Action", U.S. Appl. No. 13/471,282, Sep. 3, 2014, 13 pages.
"Non-Final Office Action", U.S. Appl. No. 13/780,228, Sep. 15, 2014, 18 pages.
"Non-Final Office Action", U.S. Appl. No. 14/063,912, Sep. 2, 2014, 11 pages.
"Notice of Allowance", U.S. Appl. No. 13/471,030, Sep. 5, 2014, 6 pages.
"Notice of Allowance", U.S. Appl. No. 13/494,651, Oct. 2, 2014, 4 pages.
"Notice of Allowance", U.S. Appl. No. 13/653,682, Sep. 24, 2014, 4 pages.
"Notice of Allowance", U.S. Appl. No. 14/277,240, Sep. 16, 2014, 4 pages.
"Restriction Requirement", U.S. Appl. No. 13/653,184, Sep. 5, 2014, 6 pages.
"Search Report", EP Application No. 09812072.8, Apr. 17, 2013, 5 Pages.
"Supplemental Notice of Allowance", U.S. Appl. No. 13/471,405, Aug. 29, 2014, 5 pages.
Boual, et al., "Wedge Displays as Cameras", Retrieved From: http://www.camfpd.com/72-3.pdf, SID Symposium Digest of Technical Papers, vol. 37, Issue 1, pp. 1999-2002, Jun. 2006, 4 Pages.
Chen, et al., "Design of a Novel Hybrid Light Guide Plate for Viewing Angle Switchable Backlight Module", Institute of Photonic Systems, Ntional Chiao Tung University, Tainan, Taiwan., Jul. 1, 2013, 4 Pages.
Chou, et al., "Imaging and Chromatic Behavior Analysis of a Wedge-Plate Display", Retrieved From: http://www.di.nctu.edu.tw/2006TDC/papers/Flexible/06-012.doc, SID Symposium Digest of Technical Papers vol. 37, Issue 1, pp. 1031-1034,Jun. 2006, 4 Pages.
Ishida, et al., "A Novel Ultra Thin Backlight System without Optical Sheets Using a Newly Developed Multi-Layered Light-guide", SID 10 Digest, Jul. 5, 2012, 4 Pages.
Nishizawa, et al., "Investigation of Novel Diffuser Films for 2D Light-Distribution Control", Tohoku University, Aramaki Aoba, Aoba-ku, Sendai 980-8579, Japan, LINTEC Corporation, 23-23 Honcho, Itabashi-ku, Tokyo 173-0001, Japan., Dec. 2011, 4 Pages.
Phillips, et al., "Links Between Holography and Lithography", Fifth International Symposium on Display Holography, 206., Feb. 17, 1995, 9 Pages.
Powell, "High-Efficiency Projection Screen", U.S. Appl. No. 14/243,501, Apr. 2, 2014, 26 Pages.
Travis, "P-60: LCD Smear Elimination by Scanning Ray Angle into a Light Guide", Retrieved From: http://www2.eng.cam.ac.uk/~arlt1/P_60.pdf, SID Symposium Digest of Technical Papers vol. 35, Issue 1, pp. 474-477, May 2004, 4 Pages.

(56) References Cited

OTHER PUBLICATIONS

Travis, et al., "Optical Design of a Flat Panel Projection Wedge Display", 9th International Display Workshops, paper FMC6-3, Dec. 4-6, 2002, Hiroshima, Japan., Dec. 2002, 4 Pages.
"Corrected Notice of Allowance", U.S. Appl. No. 13/651,232, Jul. 31, 2014, 2 pages.
"Corrected Notice of Allowance", U.S. Appl. No. 13/939,032, Jul. 15, 2014, 2 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/599,635, Aug. 8, 2014, 16 pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"Non-Final Office Action", U.S. Appl. No. 13/525,070, Aug. 14, 2014, 24 pages.
"Corrected Notice of Allowance", U.S. Appl. No. 13/494,651, Oct. 24, 2014, 2 pages.
"Corrected Notice of Allowance", U.S. Appl. No. 13/494,651, Dec. 29, 2014, 2 pages.
"Final Office Action", U.S. Appl. No. 13/471,054, Oct. 23, 2014, 17 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 13/647,479, Dec. 12, 2014, 12 pages.
"Final Office Action", U.S. Appl. No. 14/200,595, Nov. 19, 2014, 5 pages.
"Final Office Action", U.S. Appl. No. 14/225,276, Dec. 17, 2014, 6 pages.
"Foreign Office Action", CN Application No. 201320097079.5, Jul. 28, 2014, 4 pages.

"International Search Report and Written Opinion", Application No. PCT/US2014/043546, Oct. 9, 2014, 10 pages.
"Non-Final Office Action", U.S. Appl. No. 13/371,725, Nov. 3, 2014, 27 pages.
"Non-Final Office Action", U.S. Appl. No. 13/471,393, Oct. 20, 2014, 12 pages.
"Non-Final Office Action", U.S. Appl. No. 13/525,614, Nov. 24, 2014, 19 pages.
"Non-Final Office Action", U.S. Appl. No. 13/653,184, Dec. 1, 2014, 7 pages.
"Restriction Requirement", U.S. Appl. No. 13/653,218, Nov. 7, 2014, 6 pages.
"Restriction Requirement", U.S. Appl. No. 14/147,252, Dec. 1, 2014, 6 pages.
"Supplemental Notice of Allowance", U.S. Appl. No. 13/471,405, Dec. 17, 2014, 5 pages.
Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.
"Accessing Device Sensors", retrieved from <https://developer.palm.com/content/api/dev-guide/pdk/accessing-device-sensors.html> on May 25, 2012, 4 pages.
"ACPI Docking for Windows Operating Systems", Retrieved from: <http://www.scritube.com/limba/engleza/software/ACPI-Docking-for-Windows-Opera331824193.php> on Jul. 6, 2012,10 pages.
"Advanced Configuration and Power Management Specification", *Intel Corporation, Microsoft Corporation, Toshiba Corp. Revision 1*, (Dec. 22, 1996),364 pages.
"Chinese Search Report", Application No. 201110272868.3, (Apr. 1, 2013),10 pages.
"Cholesteric Liquid Crystal", Retrieved from: <http://en.wikipedia.org/wiki/Cholesteric_liquid_crystal> on Aug. 6, 2012, (Jun. 10, 2012), 2 pages.
"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 2013), 1 page.
"Corrected Notice of Allowance", U.S. Appl. No. 13/470,633, (Apr. 9, 2013), 2 pages.
"Corrected Notice of Allowance", U.S. Appl. No. 13/470,633, (Jul. 2, 2013), 2 pages.
"Corrected Notice of Allowance", U.S. Appl. No. 13/651,327, (Sep. 12, 2013), 2 pages.
"Corrected Notice of Allowance", U.S. Appl. No. 13/651,327 (Sep. 23, 2013), 2 pages.
"Corrected Notice of Allowance", U.S. Appl. No. 13/651,726, (Sep. 17, 2013), 2 pages.
"Developing Next-Generation Human Interfaces using Capacitive and Infrared Proximity Sensing", *Silicon Laboratories, Inc.,* Available at <http://www.silabs.com/pages/DownloadDoc.aspx?FILEURL=support%20documents/technicaldocs/capacitive%20and%20proximity%20sensing_wp.pdf&src=SearchResults>,(Aug. 30, 2010), pp. 1-10.
"Directional Backlighting for Display Panels", U.S. Appl. No. 13/021,448, (Feb. 4, 2011), 38 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, (Jan. 2012),4 pages.
"Final Office Action", U.S. Appl. No. 13/471,001, (Jul. 25, 2013), 20 pages.
"Final Office Action", U.S. Appl. No. 13/471,139, (Sep. 16, 2013),13 pages.
"Final Office Action", U.S. Appl. No. 13/471,336, (Aug. 28, 2013),18 pages.
"Final Office Action", U.S. Appl. No. 13/651,195, (Apr. 18, 2013),13 pages.
"Final Office Action", U.S. Appl. No. 13/651,232, (May 21, 2013), 21 pages.
"Final Office Action", U.S. Appl. No. 13/651,287, (May 3, 2013),16 pages.
"Final Office Action", U.S. Appl. No. 13/651,976, (Jul. 25, 2013), 21 pages.

(56) References Cited

OTHER PUBLICATIONS

"Final Office Action", U.S. Appl. No. 13/653,321, (Aug. 2, 2013),17 pages.
"Final Office Action", U.S. Appl. No. 13/653,682, (Oct. 18, 2013),16 pages.
"Final Office Action", U.S. Appl. No. 13/656,055, (Oct. 23, 2013),14 pages.
"Final Office Action", U.S. Appl. No. 13/938,930, (Nov. 8, 2013),10 pages.
"Final Office Action", U.S. Appl. No. 13/939,002, (Nov. 8, 2013), 7 pages.
"Final Office Action", U.S. Appl. No. 13/939,032, (Dec. 20, 2013), 5 pages.
"FingerWorks Installation and Operation Guide for the TouchStream ST and TouchStream LP", *FingerWorks, Inc.* Retrieved from <http://ec1.images-amazon.com/media/i3d/01/A/man-migrate/MANUAL000049862.pdf>, (2002),14 pages.
"First One Handed Fabric Keyboard with Bluetooth Wireless Technology", Retrieved from: <http://press.xtvworld.com/article3817.html> on May 8, 2012,(Jan. 6, 2005), 2 pages.
"For Any Kind of Proceeding 2011 Springtime as Well as Coil Nailers as Well as Hotter Summer Season",*Lady Shoe Worlds,* retrieved from <http://www.ladyshoesworld.com/2011/09/18/for-any-kind-of-proceeding-2011-springtime-as-well-as-coil-nailers-as-well-as-hotter-summer-season/> on Nov. 3, 2011,(Sep. 8, 2011), 2 pages.
"Force and Position Sensing Resistors: An Emerging Technology", *Interlink Electronics,* Available at <http://staff.science.uva.nl/~vlaander/docu/FSR/An_Exploring_Technology.pdf>,(Feb. 1990), pp. 1-6.
"Frogpad Introduces Weareable Fabric Keyboard with Bluetooth Technology", Retrieved from: <http://www.geekzone.co.nz/content.asp?contentid=3898> on May 7, 2012,(Jan. 7, 2005), 3 pages.
"How to Use the iPad's Onscreen Keyboard", Retrieved from <http://www.dummies.com/how-to/content/how-to-use-the-ipads-onscreen-keyboard.html> on Aug. 28, 2012, 3 pages.
"iControlPad 2—The open source controller", Retrieved from <http://www.kickstarter.com/projects/1703567677/icontrolpad-2-the-open-source-controller> on Nov. 20, 2012, (2012),15 pages.
"i-Interactor electronic pen", Retrieved from: <http://www.alibaba.com/product-gs/331004878/i_Interactor_electronic_pen.html> on Jun. 19, 2012, 5 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"International Search Report and Written Opinion", Application No. PCT/US2011/050471,(Apr. 9, 2012), 8 pages.
"International Search Report and Written Opinion", Application No. PCT/US2013/028479, (Jun. 17, 2013), 10 pages.
"International Search Report and Written Opinion", Application No. PCT/US2013/029461, (Jun. 21, 2013),11 pages.
"International Search Report and Written Opinion", Application No. PCT/US2013/028948, (Jun. 21, 2013),11 pages.
"International Search Report and Written Opinion", Application No. PCT/US2013/044871, (Aug. 14, 2013),12 pages.
"International Search Report and Written Opinion", Application No. PCT/US2013/040968, (Sep. 5, 2013),12 pages.
"International Search Report and Written Opinion", Application No. PCT/US2013/045049, (Sep. 16, 2013), 9 pages.
"International Search Report and Written Opinion", Application No. PCT/US2013/042550, (Sep. 24, 2013),14 pages.
"International Search Report and Written Opinion", Application No. PCT/US2013/043961, (Oct. 17, 2013),11 pages.
"Membrane Keyboards & Membrane Keypads", Retrieved from: <http://www.pannam.com/> on May 9, 2012,(Mar. 4, 2009), 2 pages.
"Microsoft Develops Glasses-Free Eye-Tracking 3D Display", *Tech-FAQ*—retrieved from <http://www.tech-faq.com/microsoft-develops-glasses-free-eye-tracking-3d-display.html> on Nov. 2, 2011, (Nov. 2, 2011),3 pages.
"Microsoft Reveals Futuristic 3D Virtual HoloDesk Patent", Retrieved from <http://www.patentbolt.com/2012/05/microsoft-reveals-futuristic-3d-virtual-holodesk-patent.html> on May 28, 2012, (May 23, 2012), 9 pages.
"Motion Sensors",*Android Developers,* retrieved from <http://developer.android.com/guide/topics/sensors/sensors_motion.html> on May 25, 2012, 7 pages.
"MPC Fly Music Production Controller", *AKAI Professional,* Retrieved from: <http://www.akaiprompc.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 12/882,994, (Feb. 1, 2013),17 pages.
"Non-Final Office Action", U.S. Appl. No. 13/021,448, (Dec. 13, 2012), 9 pages.
"Non-Final Office Action", U.S. Appl. No. 13/021,448, (Aug. 16, 2013), 25 pages.
"Non-Final Office Action", U.S. Appl. No. 13/371,725, (Nov. 7, 2013),19 pages.
"Non-Final Office Action", U.S. Appl. No. 13/471,001, (Feb. 19, 2013),15 pages.
"Non-Final Office Action", U.S. Appl. No. 13/471,139, (Mar. 21, 2013),12 pages.
"Non-Final Office Action", U.S. Appl. No. 13/471,202, (Feb. 11, 2013),10 pages.
"Non-Final Office Action", U.S. Appl. No. 13/471,336, (Jan. 18, 2013),14 pages.
"Non-Final Office Action", U.S. Appl. No. 13/527,263, (Jul. 19, 2013), 5 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,195, (Jan. 2, 2013),14 pages.
"Non-Final Office Action", U.S. Appl. No. 13/651,232, (Jan. 17, 2013),15 pages.
"Non-Final Office Action", U.S. Appl. No. 13/651,232, (Dec. 5, 2013),15 pages.
"Non-Final Office Action", U.S. Appl. No. 13/651,272, (Feb. 12, 2013),10 pages.
"Non-Final Office Action", U.S. Appl. No. 13/651,287, (Jan. 29, 2013),13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,726, (Apr. 15, 2013), 6 pages.
"Non-Final Office Action", U.S. Appl. No. 13/651,871, (Mar. 18, 2013),14 pages.
"Non-Final Office Action", U.S. Appl. No. 13/651,871, (Jul. 1, 2013),5 pages.
"Non-Final Office Action", U.S. Appl. No. 13/651,976, (Feb. 22, 2013),16 pages.
"Non-Final Office Action", U.S. Appl. No. 13/653,321, (Feb. 1, 2013),13 pages.
"Non-Final Office Action", U.S. Appl. No. 13/653,682, (Feb. 7, 2013),11 pages.
"Non-Final Office Action", U.S. Appl. No. 13/653,682, (Jun. 3, 2013),14 pages.
"Non-Final Office Action", U.S. Appl. No. 13/656,055, (Apr. 23, 2013),11 pages.
"Non-Final Office Action", U.S. Appl. No. 13/656,520, (Feb. 1, 2013),15 pages.
"Non-Final Office Action", U.S. Appl. No. 13/656,520, (Jun. 5, 2013), 8 pages.
"Non-Final Office Action", U.S. Appl. No. 13/780,228, (Oct. 30, 2013),12 pages.

(56) References Cited

OTHER PUBLICATIONS

"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,002, (Dec. 20, 2013), 5 pages.
"Non-Final Office Action", U.S. Appl. No. 13/939,032, (Aug. 29, 2013), 7 pages.
"Notice of Allowance", U.S. Appl. No. 12/882,994, (Jul. 12, 2013), 9 pages.
"Notice of Allowance", U.S. Appl. No. 13/470,633, (Mar. 22, 2013), 7 pages.
"Notice of Allowance", U.S. Appl. No. 13/471,202, (May 28, 2013), 7 pages.
"Notice of Allowance", U.S. Appl. No. 13/563,435, (Nov. 12, 2013), 5 pages.
"Notice of Allowance", U.S. Appl. No. 13/565,124, (Dec. 24, 2013), 6 pages.
"Notice of Allowance", U.S. Appl. No. 13/651,195, (Jul. 8, 2013), 9 pages.
"Notice of Allowance", U.S. Appl. No. 13/651,272, (May 2, 2013), 7 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"Notice of Allowance", U.S. Appl. No. 13/651,726, (May 31, 2013), 5 pages.
"Notice of Allowance", U.S. Appl. No. 13/651,871, (Oct. 2, 2013), 7 pages.
"Notice of Allowance", U.S. Appl. No. 13/653,321, (Dec. 18, 2013), 41 pages.
"Notice of Allowance", U.S. Appl. No. 13/656,520, (Oct. 2, 2013), 5 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"Optical Sensors in Smart Mobile Devices", *ON Semiconductor, TND415/D*, Available at <http://www.onsemi.jp/pub_link/Collateral/TND415-D.PDF>,(Nov. 2010), pp. 1-13.
"Optics for Displays: Waveguide-based Wedge Creates Collimated Display Backlight", *OptoIQ*, retrieved from <http://www.optoiq.com/index/photonics-technologies-applications/lfw-display/lfw-article-display.articles.laser-focus-world.volume-46.issue-1.world-news.optics-for_displays.html> on Nov. 2, 2010,(Jan. 1, 2010), 3 pages.
"PCT Search Report", Application No. PCT/US2013/042790, (Aug. 8, 2013), 9 pages.
"Position Sensors", *Android Developers*, retrieved from <http://developer.android.com/guide/topics/sensors/sensors_position.html> on May 25, 2012, 5 pages.
"Real-Time Television Content Platform", retrieved from <http://www.accenture.com/us-en/pages/insight-real-time-television-platform.aspx> on Mar. 10, 2011, (May 28, 2002), 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/468,918, (Nov. 29, 2013), 6 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"Restriction Requirement", U.S. Appl. No. 13/715,229, (Aug. 13, 2013), 7 pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>, (2009), 2 pages.
"SoIRxTM E-Series Multidirectional Phototherapy ExpandableTM 2-Bulb Full Body Panel System", Retrieved from: <http://www.solarcsystems.com/us_multidirectional_uv_light_therapy_1_intro.html > on Jul. 25, 2012,(2011), 4 pages.
"The Microsoft Surface Tablets Comes With Impressive Design and Specs", Retrieved from <http://microsofttablereview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008),11 Pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
"Welcome to Windows 7", Retrieved from: <http://www.microsoft.com/en-us/download/confirmation.aspx?id=4984> on Aug. 1, 2013, (Sep. 16, 2009), 3 pages.
"What is Active Alignment?", http://www.kasalis.com/active_alignment.html, retrieved on Nov. 22, 2012, 2 Pages.
"What is the PD-Net Project About?", retrieved from <http://pd-net.org/about/> on Mar. 10, 2011, (Mar. 10, 2011), 3 pages.
"Write & Learn Spellboard Advanced", Available at <http://somemanuals.com/VTECH,WRITE%2526LEARN--SPELLBOARD--ADV--71000,JIDFHE.PDF>, (2006), 22 pages.
Bathiche, Steven N., et al., "Input Device with Interchangeable Surface", U.S. Appl. No. 13/974,749, (Aug. 23, 2013), 51 pages.
Bert, et al., "Passive Matrix Addressing of Electrophoretic Image Display", *Conference on International Display Research Conference,* Retrieved from <http://www.cmst.be/publi/eurodisplay2002_s14-1.pdf>,(Oct. 1, 2002), 4 pages.
Block, Steve et al., "DeviceOrientation Event Specification", *W3C, Editor's Draft,* retrieved from <https://developer.palm.com/content/api/dev-guide/pdk/accessing-device-sensors.html> on May 25, 2012,(Jul. 12, 2011), 14 pages.
Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.
Burge, et al., "Determination of off-axis aberrations of imaging systems using on-axis measurements", *SPIE Proceeding,* Retrieved from <http://www.loft.optics.arizona.edu/documents/journal_articles/Jim_Burge_Determinationaxis_measurements.pdf>,(Sep. 21, 2011),10 pages.
Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.
Chang, Jee-Gong et al., "Optical Design and Analysis of LCD Backlight Units Using ASAP", *Optical Engineering,* Available at <http://www.opticsvalley.com/resources/kbasePDF/ma_oe_001_optical_design.pdf>,(Jun. 2003),15 pages.
Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Dietz, Paul H., et al., "A Practical Pressure Sensitive Computer Keyboard", In Proceedings of UIST 2009,(Oct. 2009), 4 pages.
Diverdi, et al., "An Immaterial Pseudo-3D Display with 3D Interaction", *In the proceedings of Three-Dimensional Television: Capture,*

(56) References Cited

OTHER PUBLICATIONS

*Transmission, and Display, Springer,* Retrieved from <http://www.cs.ucsb.edu/~holl/pubs/DiVerdi-2007-3DTV.pdf>,(Feb. 6, 2007), 26 pages.
Gaver, William W., et al., "A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012,(May 7, 1995), 9 pages.
Glatt, Jeff "Channel and Key Pressure (Aftertouch).", Retrieved from: <http://home.roadrunner.com/~jgglatt/tutr/touch.htm> on Jun. 11, 2012, 2 pages.
Grossman, et al., "Multi-Finger Gestural Interaction with 3D Volumetric Displays", *In the proceedings of the 17th annual ACM symposium on User interface software and technology,* Retrieved from <http://www.dgp.toronto.edu/papers/tgrossman_UIST2004.pdf>,(Oct. 24, 2004), 61-70.
Hanlon, Mike "ElekTex Smart Fabric Keyboard Goes Wireless", Retrieved from: <http://www.gizmag.com/go/5048/ > on May 7, 2012,(Jan. 15, 2006), 5 pages.
Harada, Susumu et al., "VoiceDraw: A Hands-Free Voice-Driven Drawing Application for People With Motor Impairments", *In Proceedings of Ninth International ACM SIGACCESS on Computers and Accessibility,* retrieved from <http://citeseerx.ist.psu.edu/viewdoc/download?doi=10.1.1.113.7211&rep=rep1&type=pdf> on Jun. 1, 2012,(Oct. 15, 2007), 8 pages.
Hinckley, Ken et al., "Codex: A Dual Screen Tablet Computer", *Conference on Human Factors in Computing Systems,* (Apr. 9, 2009), 10 pages.
Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> *Proceedings: Journal of Microelectromechanical Systems,* (Dec. 2005), 7 pages.
Izadi, Shahram et al., "ThinSight: A Thin Form-Factor Interactive Surface Technology", *Communications of the ACM,* vol. 52, No. 12, retrieved from <http://research.microsoft.com/pubs/132532/p90-izadi.pdf> on Jan. 5, 2012,(Dec. 2009), pp. 90-98.
Jacobs, et al., "2D/3D Switchable Displays", *In the proceedings of Sharp Technical Journal* (4), Available at <https://cgi.sharp.co.jp/corporate/rd/journal-85/pdf/85-04.pdf>,(Apr. 2003), pp. 15-18.
Kaufmann, Benoit et al., "Hand Posture Recognition Using Real-time Artificial Evolution", *EvoApplications'09,* retrieved from <http://evelyne.lutton.free.fr/Papers/KaufmannEvolASP2010.pdf> Jan. 5, 2012,(Apr. 3, 2010),10 pages.
Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.
Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.
Kim, Min Su et al., "A Controllable Viewing Angle LCD with an Optically isotropic liquid crystal", *Journal of Physics D: Applied Physics,* vol. 43, No. 14, (Mar. 23, 2010),7 Pages.
Lance, David M., et al., "Media Processing Input Device", U.S. Appl. No. 13/655,065, filed Oct. 18, 2012, 43 pages.
Lee, C.M.G "Flat-Panel Autostereoscopic 3D Display", *Optoelectronics, IET,* Available at <http://ieeexplore.ieee.org/stamp/stamp.jsp?arnumber=04455550>,(Feb. 2008), pp. 24-28.
Lee, et al., "Depth-Fused 3D Imagery on an Immaterial Display", *In the proceedings of IEEE Transactions on Visualization and Computer Graphics,* vol. 15, No. 1, Retrieved from <http://ieeexplore.ieee.org/stamp/stamp.jsp?arnumber=04540094>,(Jan. 2009),20-33.
Lee, et al., "LED Light Coupler Design for a Ultra Thin Light Guide", *Journal of the Optical Society of Korea,* vol. 11, Issue.3, Retrieved from <http://opticslab.kongju.ac.kr/pdf/06.pdf>,(Sep. 2007), 5 pages.
Li, et al., "Characteristic Mode Based Tradeoff Analysis of Antenna-Chassis Interactions for Multiple Antenna Terminals", *In IEEE Transactions on Antennas and Propagation,* Retrieved from <http://ieeexplore.ieee.org/stamp/stamp.jsp?tp=&arnumber=6060882>,(Feb. 2012),13 pages.
Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002),5 pages.
Liu, et al., "Three-dimensional PC: toward novel forms of human-computer interaction", *In the proceedings of Three-Dimensional Video and Display: Devices and Systems vol. CR76,* Retrieved from <http://www.google.co.in/url?sa=t&rct=j&q=Three-dimensional+PC:+toward+novel+forms+of+human-computer+interaction&source=web&cd=1&ved=0CFoQFjAA&url=http%3A%2F%2Fciteseerx.ist.psu.edu%2Fviewdoc%2Fdownload%3Fdoi%3D10.1.1.32.9469%26rep%3Drep1%26,(Nov. 5, 2000), 250-281.
Manresa-Yee, Cristina et al., "Experiences Using a Hands-Free Interface", *In Proceedings of the 10th International ACM SIGACCESS Conference on Computers and Accessibility,* retrieved from <http://dmi.uib.es/~cmanresay/Research%5BMan08%5DAssets08.pdf> on Jun. 1, 2012,(Oct. 13, 2008), pp. 261-262.
McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.
Miller, Matthew "MOGA gaming controller enhances the Android gaming experience", Retrieved from <http://www.zdnet.com/moga-gaming-controller-enhances-the-android-gaming-experience-7000007550/> on Nov. 20, 2012, (Nov. 18, 2012), 9 pages.
Morookian, et al., "Ambient-Light-Canceling Camera Using Subtraction of Frames", *NASA Tech Briefs,* Retrieved from <http://ntrs.nasa.gov/archive/nasa/casi.ntrs.nasa.gov/20110016693_2011017808.pdf>,(May 2004), 2 pages.
Nakanishi, Hideyuki et al., "Movable Cameras Enhance Social Telepresence in Media Spaces", *In Proceedings of the 27th International Conference on Human Factors in Computing Systems,* retrieved from <http://smg.ams.eng.osaka-u.ac.jp/~nakanishi/hnp_2009_chi.pdf> on Jun. 1, 2012,(Apr. 6, 2009), 10 pages.
Peli, Eli "Visual and Optometric Issues with Head-Mounted Displays", *IS & T/OSA Optics & Imaging in the Information Age, The Society for Imaging Science and Technology,* available at <http://www.u.arizona.edu/~zrui3/zhang_pHMPD_spie07.pdf>,(1996), pp. 364-369.
Piltch, Avram "ASUS Eee Pad Slider SL101 Review", Retrieved from <http://www.laptopmag.com/review/tablets/asus-eee-pad-slider-sl101.aspx>, (Sep. 22, 2011), 5 pages.
Post, E.R. et al., "E-Broidery: Design and Fabrication of Textile-Based Computing", IBM Systems Journal, vol. 39, Issue 3 & 4,(Jul. 2000), pp. 840-860.
Prospero, Michael "Samsung Outs Series 5 Hybrid PC Tablet", Retrieved from: <http://blog.laptopmag.com/samsung-outs-series-5-hybrid-pc-tablet-running-windows-8> on Oct. 31, 2013, (Jun. 4, 2012), 7 pages.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012),15 pages.
Qin, Yongqiang et al., "pPen: Enabling Authenticated Pen and Touch Interaction on Tabletop Surfaces", *In Proceedings of ITS 2010,* Available at <http://www.dfki.de/its2010/papers/pdf/po172.pdf>,(Nov. 2010), pp. 283-284.
Reilink, Rob et al., "Endoscopic Camera Control by Head Movements for Thoracic Surgery", *In Proceedings of 3rd IEEE RAS & EMBS International Conference of Biomedical Robotics and Biomechatronics,* retrieved from <http://doc.utwente.nl/74929/1/biorob_online.pdf> on Jun. 1, 2012,(Sep. 26, 2010), pp. 510-515.
Reisman, et al., "A Screen-Space Formulation for 2D and 3D Direct Manipulation", *In the proceedings of the 22nd annual ACM symposium on User interface,* Retrieved from <http://innovis.cpsc.ucalgary.ca/innovis/uploads/Courses/TableTopDetails2009/Reisman2009.pdf>,(Oct. 4, 2009), 69-78.

(56) References Cited

OTHER PUBLICATIONS

Schoning, Johannes et al., "Building Interactive Multi-Touch Surfaces", *Journal of Graphics, GPU, and Game Tools*, vol. 14, No. 3, available at <http://www.libavg.com/raw-attachment/wiki/Multitouch/Multitouchguide_draft.pdf>,(Nov. 2009), pp. 35-55.
Staff, "Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, (Nov. 18, 2011), 5 pages.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012 (Aug. 7, 2009), 4 pages.
Sundstedt, Veronica "Gazing at Games: Using Eye Tracking to Control Virtual Characters", *In ACM SIGGRAPH 2010 Courses*, retrieved from <http://www.tobii.com/Global/Analysis/Training/EyeTrackAwards/veronica_sundstedt.pdf> Jun. 1, 2012,(Jul. 28, 2010), 85 pages.
Takamatsu, Seiichi et al., "Flexible Fabric Keyboard with Conductive Polymer-Coated Fibers", In Proceedings of Sensors 2011,(Oct. 28, 2011), 4 pages.
Travis, Adrian et al., "Collimated Light from a Waveguide for a Display Backlight", *Optics Express*, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009,(Oct. 15, 2009), 6 pages.
Travis, Adrian et al., "P-127: Linearity in Flat Panel Wedge Projection", *SID 03 Digest*, retrieved from <http://www2.eng.cam.ac.uk/~arlt1/Linearity%20in%20flat%20panel%20wedge%20projection.pdf>,(May 12, 2005), pp. 716-719.
Travis, Adrian et al., "The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010,4 pages.
Travis, Adrian R., et al., "Flat Projection for 3-D", *In Proceedings of the IEEE*, vol. 94, Issue: 3, Available at <http://ieeexplore.ieee.org/stamp/stamp.jsp?tp=&arnumber=1605201>,(Mar. 13, 2006), pp. 539-549.
Valli, Alessandro "Notes on Natural Interaction", retrieved from <http://www.idemployee.id.tue.nl/g.w.m.rauterberg/lecturenotes/valli-2004.pdf> on Jan. 5, 2012,(Sep. 2005), 80 pages.
Valliath, G T., "Design of Hologram for Brightness Enhancement in Color LCDs", Retrieved from <http://www.loreti.it/Download/PDF/LCD/44_05.pdf> on Sep. 17, 2012, (May 1998), 5 pages.
Vaucelle, Cati "Scopemate, A Robotic Microscope!", *Architectradure*, retrieved from <http://architectradure.blogspot.com/2011/10/at-uist-this-monday-scopemate-robotic.html> on Jun. 6, 2012,(Oct. 17, 2011), 2 pages.
"Advisory Action", U.S. Appl. No. 13/939,032, Feb. 24, 2014, 2 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Final Office Action", U.S. Appl. No. 13/021,448, Jan. 16, 2014, 33 Pages.
"Final Office Action", U.S. Appl. No. 13/564,520, Jan. 15, 2014, 7 pages.
"Foreign Office Action", CN Application No. 201320097066.8, Oct. 24, 2013, 5 Pages.
"International Search Report and Written Opinion", Application No. PCT/US2013/055679, Nov. 18, 2013, 8 pages.
"Non-Final Office Action", U.S. Appl. No. 13/599,635, Feb. 25, 2014, 13 pages.
"Non-Final Office Action", U.S. Appl. No. 13/471,405, Feb. 20, 2014, 37 pages.
"Non-Final Office Action", U.S. Appl. No. 13/494,651, Feb. 4, 2014, 15 pages.
"Non-Final Office Action", U.S. Appl. No. 13/525,070, Jan. 17, 2014, 19 pages.
"Non-Final Office Action", U.S. Appl. No. 13/564,520, Feb. 14, 2014, 5 pages.
"Non-Final Office Action", U.S. Appl. No. 14/063,912, Jan. 2, 2014, 10 pages.
"Notice of Allowance", U.S. Appl. No. 13/938,930, Feb. 20, 2014, 4 pages.
Lee, "Flat-panel Backlight for View-sequential 3D Display", Optoelectronics, IEE Proceedings-.vol. 151. No. 6 IET, Dec. 2004, 4 pages.
"Corrected Notice of Allowance", U.S. Appl. No. 14/277,240, Jan. 8, 2015, 2 pages.
"Final Office Action", U.S. Appl. No. 13/021,448, Jan. 2, 2015, 19 pages.
"Final Office Action", U.S. Appl. No. 13/468,882, Feb. 12, 2015, 9 pages.
"Final Office Action", U.S. Appl. No. 13/470,951, Jan. 12, 2015, 20 pages.
"Final Office Action", U.S. Appl. No. 13/525,070, Jan. 29, 2015, 30 pages.
"Final Office Action", U.S. Appl. No. 13/527,263, Jan. 27, 2015, 7 pages.
"Final Office Action", U.S. Appl. No. 14/063,912, Jan. 12, 2015, 12 pages.
"First Examination Report", NZ Application No. 628690, Nov. 27, 2014, 2 pages.
"Foreign Office Action", CN Application No. 201080037117.7, Aug. 20, 2013, 10 pages.
"Foreign Office Action", CN Application No. 201210023945.6, Dec. 3, 2013, 13 pages.
"Non-Final Office Action", U.S. Appl. No. 13/471,030, Jan. 15, 2015, 7 pages.
"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Non-Final Office Action", U.S. Appl. No. 14/147,252, Feb. 23, 2015, 11 pages.
"Notice of Allowance", U.S. Appl. No. 13/595,700, Jan. 21, 2015, 4 pages.
"Notice of Allowance", U.S. Appl. No. 13/651,976, Jan. 21, 2015, 10 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Corrected Notice of Allowance", U.S. Appl. No. 13/651,232, Apr. 24, 2015, 2 pages.
"Corrected Notice of Allowance", U.S. Appl. No. 13/656,055, Apr. 13, 2015, 2 pages.
"Final Office Action", U.S. Appl. No. 13/371,725, Mar. 3, 2015, 30 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/225,250, Mar. 13, 2015, 7 pages.
"Foreign Notice on Reexamination", CN Application No. 201320097066.8, Apr. 3, 2015, 7 Pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/471,412, Jun. 1, 2015, 31 pages.
"Non-Final Office Action", U.S. Appl. No. 13/525,070, May 18, 2015, 32 pages.

(56) References Cited

OTHER PUBLICATIONS

"Non-Final Office Action", U.S. Appl. No. 13/647,479, Apr. 28, 2015, 11 pages.
"Non-Final Office Action", U.S. Appl. No. 13/653,218, Mar. 4, 2015, 16 pages.
"Non-Final Office Action", U.S. Appl. No. 13/852,848, Mar. 26, 2015, 7 pages.
"Non-Final Office Action", U.S. Appl. No. 14/063,912, May 7, 2015, 12 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,030, Apr. 6, 2015, 6 pages.
"Notice of Allowance", U.S. Appl. No. 13/471,282, Apr. 30, 2015, 8 pages.
"Notice of Allowance", U.S. Appl. No. 13/564,520, May 8, 2015, 4 pages.
"Notice of Allowance", U.S. Appl. No. 13/651,232, Mar. 30, 2015, 7 pages.
"Notice of Allowance", U.S. Appl. No. 13/653,184, Mar. 10, 2015, 6 pages.
"Notice of Allowance", U.S. Appl. No. 13/656,055, Mar. 4, 2015, 7 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/656,055, May 15, 2015, 2 pages.
Schafer, "Using Interactive Maps for Navigation and Collaboration", CHI '01 Extended communication to applicant.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Corrected Notice of Allowance", U.S. Appl. No. 14/200,595, Jun. 4, 2015, 3 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 13/852,848, Jul. 20, 2015, 9 pages.
"Final Office Action", U.S. Appl. No. 14/147,252, Jun. 25, 2015, 11 pages.
"Foreign Office Action", CN Application No. 201310067335.0, Jun. 12, 2015, 15 Pages.
"Foreign Office Action", CN Application No. 201310067808.7, May 28, 2015, 14 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"Non-Final Office Action", U.S. Appl. No. 13/471,336, Jun. 24, 2015, 15 pages.
"Non-Final Office Action", U.S. Appl. No. 13/525,614, Jul. 31, 2015, 20 pages.
"Non-Final Office Action", U.S. Appl. No. 14/727,001, Jul. 10, 2015, 7 pages.
"Notice of Allowance", U.S. Appl. No. 14/225,276, Jun. 22, 2015, 4 pages.
"Notice of Allowance", U.S. Appl. No. 14/457,881, Jul. 22, 2015, 7 pages.
"Restriction Requirement", U.S. Appl. No. 13/598,898, Jul. 17, 2015, 6 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
"Supplemental Notice of Allowance", U.S. Appl. No. 13/653,184, Jun. 24, 2015, 2 pages.
"Supplemental Notice of Allowance", U.S. Appl. No. 13/656,055, Jun. 10, 2015, 2 pages.
Cunningham, "Software Infrastructure for Natural Language Processing", In Proceedings of the fifth conference on Applied natural language processing, Mar. 31, 1997, pp. 237-244.
"Corrected Notice of Allowance", U.S. Appl. No. 13/021,448, Aug. 17, 2015, 2 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 14/225,276, Aug. 27, 2015, 2 pages.
"Corrected Notice of Allowance", U.S. Appl. No. 14/457,881, Aug. 20, 2015, 2 pages.
"Final Office Action", U.S. Appl. No. 14/063,912, Sep. 3, 2015, 13 pages.
"Foreign Office Action", CN Application No. 201280029520.4, Jun. 30, 2015, 11 pages.
"Foreign Office Action", CN Application No. 201310067385.9, Aug. 6, 2015, 16 pages.
"Non-Final Office Action", U.S. Appl. No. 14/225,250, Aug. 19, 2015, 9 pages.
"Non-Final Office Action", U.S. Appl. No. 14/225,276, Aug. 19, 2015, 9 pages.
"Notice of Allowance", U.S. Appl. No. 13/021,448, Jul. 30, 2015, 11 pages.
"Supplemental Notice of Allowance", U.S. Appl. No. 13/468,918, Aug. 7, 2015, 4 pages.
"Advisory Action", U.S. Appl. No. 13/471,376, Sep. 23, 2015, 7 pages.
"Corrected Notice of Allowance", U.S. Appl. No. 13/564,520, Sep. 17, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Oct. 2, 2015, 2 pages.
"Decision on Reexamination", CN Application No. 201320097079.5, Sep. 7, 2015, 8 Pages.
"Extended European Search Report", EP Application No. 13858620.1, Sep. 18, 2015, 6 pages.
"Extended European Search Report", EP Application No. 13858834.8, Oct. 29, 2015, 8 pages.
"Extended European Search Report", EP Application No. 13859280.3, Sep. 7, 2015, 6 pages.
"Extended European Search Report", EP Application No. 13859406.4, Sep. 8, 2015, 6 pages.
"Final Office Action", U.S. Appl. No. 13/647,479, Sep. 17, 2015, 11 pages.
"Final Office Action", U.S. Appl. No. 13/653,218, Oct. 5, 2015, 16 pages.
"Final Office Action", U.S. Appl. No. 13/689,541, Nov. 2, 2015, 21 pages.
"Foreign Office Action", CN Application No. 201310065273.X, Oct. 28, 2015, 14 pages.
"Foreign Office Action", CN Application No. 201310067592.4, Oct. 23, 2015, 12 Pages.
"Foreign Office Action", CN Application No. 201310067622.1, Oct. 27, 2015, 14 pages.

(56) References Cited

OTHER PUBLICATIONS

"Foreign Office Action", CN Application No. 201310067627.4, Sep. 28, 2015, 14 pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/468,882, Nov. 13, 2015, 9 pages.
"Non-Final Office Action", U.S. Appl. No. 13/470,951, Oct. 1, 2015, 29 pages.
"Non-Final Office Action", U.S. Appl. No. 13/471,393, Sep. 30, 2015, 15 pages.
"Non-Final Office Action", U.S. Appl. No. 13/598,898, Oct. 23, 2015, 18 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Notice of Allowance", U.S. Appl. No. 13/471,054, Sep. 25, 2015, 7 pages.
"Notice of Allowance", U.S. Appl. No. 13/471,376, Nov. 23, 2015, 9 pages.
"Notice of Allowance", U.S. Appl. No. 13/471,412, Nov. 20, 2015, 10 pages.
"Notice of Allowance", U.S. Appl. No. 13/525,070, Sep. 25, 2015, 4 pages.
"Notice of Allowance", U.S. Appl. No. 13/852,848, Nov. 19, 2015, 4 pages.
"Notice of Allowance", U.S. Appl. No. 14/727,001, Oct. 2, 2015, 4 pages.
"Restriction Requirement", U.S. Appl. No. 13/891,109, Sep. 22, 2015, 6 pages.
"Supplemental Notice of Allowance", U.S. Appl. No. 13/468,949, Sep. 14, 2015, 2 pages.
"Supplemental Notice of Allowance", U.S. Appl. No. 13/471,054, Nov. 19, 2015, 2 pages.
"Supplemental Notice of Allowance", U.S. Appl. No. 13/525,070, Oct. 19, 2015, 2 pages.
"Supplementary Euorpean Search Report", EP Application No. 13728568.0, Oct. 30, 2015, 7 pages.
"Corrected Notice of Allowance", U.S. Appl. No. 13/471,054, Jan. 11, 2016, 2 pages.
"Corrected Notice of Allowance", U.S. Appl. No. 13/525,070, Jan. 13, 2016, 2 pages.
"Corrected Notice of Allowance", U.S. Appl. No. 13/527,263, Jan. 4, 2016, 2 pages.
"Corrected Notice of Allowance", U.S. Appl. No. 13/527,263, Jan. 11, 2016, 2 pages.
"Corrected Notice of Allowance", U.S. Appl. No. 14/727,001, Dec. 15, 2015, 2 pages.
"Extended European Search Report", EP Application No. 13857958.6, Dec. 18, 2015, 8 pages.
"Extended European Search Report", EP Application No. 13858283.8, Nov. 23, 2015, 10 pages.
"Extended European Search Report", EP Application No. 13858397.6, Nov. 30, 2015, 7 pages.
"Extended European Search Report", EP Application No. 13858674.8, Nov. 27, 2015, 6 pages.
"Extended European Search Report", EP Application No. 13860272.7, Dec. 14, 2015, 9 pages.
"Extended European Search Report", EP Application No. 13860836.9, Nov. 27, 2015, 9 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Foreign Office Action", CN Application No. 201310067373.6, Dec. 23, 2015, 15 Pages.
"Foreign Office Action", CN Application No. 201310067429.8, Nov. 25, 2015, 12 Pages.
"Foreign Office Action", CN Application No. 201310067631.0, Dec. 10, 2015, 11 Pages.
"Foreign Office Action", CN Application No. 201310067641.4, Dec. 30, 2015, 12 Pages.
"Foreign Office Action", CN Application No. 201310067808.7, Jan. 7, 2016, 6 Pages.
"Non-Final Office Action", U.S. Appl. No. 13/492,232, Dec. 17, 2015, 11 pages.
"Notice of Allowance", U.S. Appl. No. 13/527,263, Dec. 9, 2015, 6 pages.
"Notice of Allowance", U.S. Appl. No. 13/647,479, Jan. 14, 2016, 8 pages.
"Notice of Allowance", U.S. Appl. No. 14/727,001, Dec. 15, 2015, 2 pages.
"Restriction Requirement", U.S. Appl. No. 14/794,182, Dec. 22, 2015, 6 pages.
"Corrected Notice of Allowance", U.S. Appl. No. 13/471,412, Feb. 16, 2016, 2 pages.
"Corrected Notice of Allowance", U.S. Appl. No. 13/852,848, Jan. 29, 2016, 2 pages.
"Corrected Notice of Allowance", U.S. Appl. No. 14/727,001, Jan. 25, 2016, 2 pages.
"Final Office Action", U.S. Appl. No. 14/225,250, Jan. 29, 2016, 10 pages.
"Non-Final Office Action", U.S. Appl. No. 13/891,109, Jan. 29, 2016, 8 pages.
"Notice of Allowance", U.S. Appl. No. 13/371,725, Jan. 29, 2016, 10 pages.

* cited by examiner

SENSING USER INPUT AT DISPLAY AREA EDGE

RELATED APPLICATIONS

This application is a continuation of and claims priority to U.S. patent application Ser. No. 13/651,195, filed Oct. 12, 2012, entitled "Sensing User Input At Display Area Edge", which is a continuation of and claims priority to U.S. patent application Ser. No. 13/471,376, filed May 14, 2012, entitled "Sensing User Input At Display Area Edge", and which further claims priority under 35 U.S.C. §119(e) to the following U.S. Provisional patent applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. Traditional mobile computing devices oftentimes employ displays with touchscreen functionality to allow users to input various data or requests to the computing device. However, it can be difficult to recognize certain user inputs with such traditional mobile computing devices, providing frustrating and unfriendly experiences for the users.

SUMMARY

Sensing user input at display area edge techniques are described.

In one or more implementations, input data for a user input is received, the input data having been sensed by one or more sensors. The input data includes data for locations touched by an object in an active display area of an interactive display device as well as data for locations touched by the object in an area outside of the active display area of the interactive display device. Based on the data for the locations touched by the object in the active display area as well as the locations touched by the object in the area outside of the active display area, the user input is determined.

In one or more implementations, a computing device includes a housing and a display device supported by the housing and having an active display area. The display device has one or more sensors disposed for sensing locations of the active display area that are touched by an object while inputting a user input to the computing device as well as locations outside of the active display area that are touched by the object while inputting the user input. The computing device determines the user input based on both the locations of the active display area that are touched by the object and the locations outside of the active display area that are touched by the object.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Sensing user input at display area edge techniques are described. One or more sensors are disposed to sense user inputs in an active display area as well as to sense user inputs in an extended area that is outside of the active display area. Data for user inputs, such as gestures, may include data from user inputs sensed in both the active display area and outside of the active display area. Thus, user inputs can begin and/or end outside of the active display area.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment and Procedures

Figure 1:
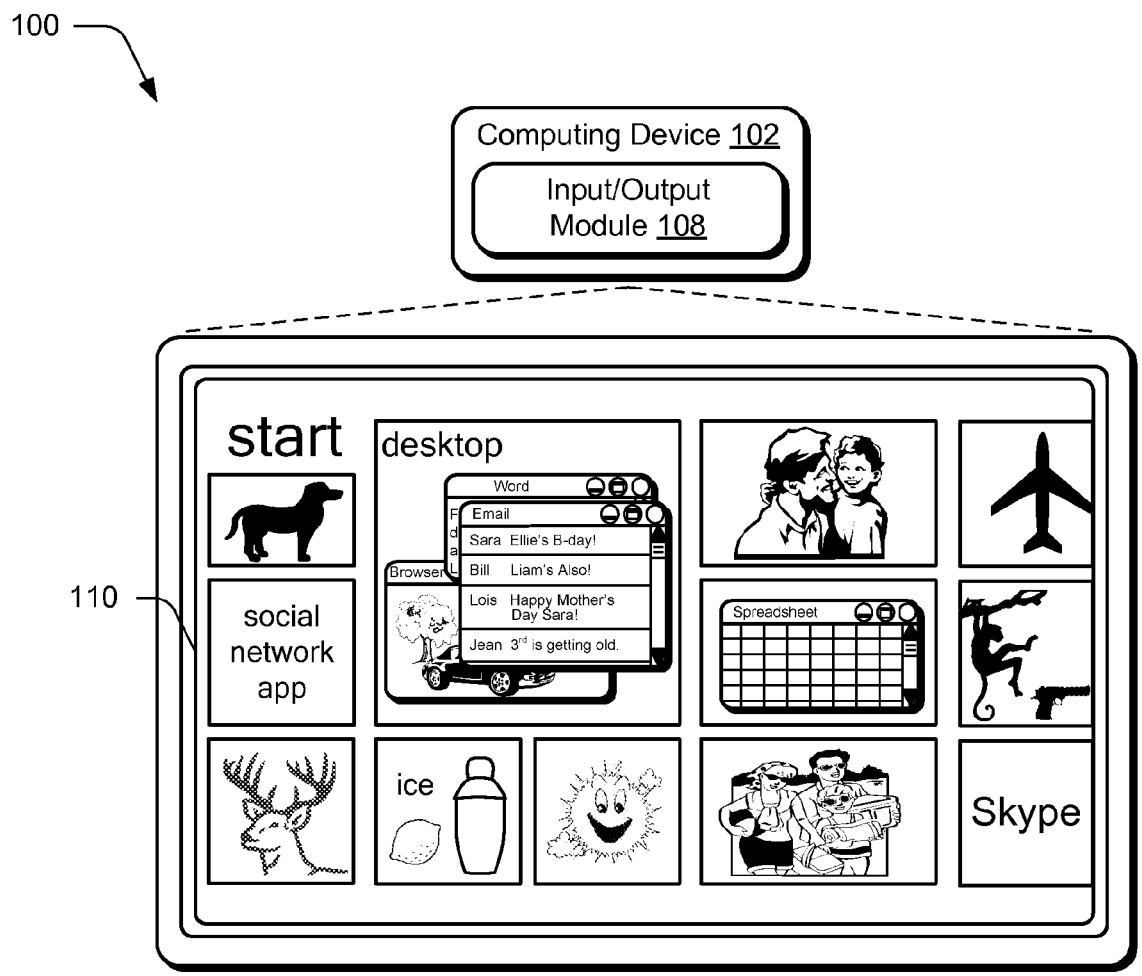
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102, which may be configured in a variety of ways. For example, the computing device 102 may be configured for mobile use, such as a mobile phone, a tablet computer, and so on. However, the techniques discussed herein are also applicable to multiple types of devices other than those for mobile use, and may be used with any of a variety of different devices that use an input sensor over or in a display area. For example, the computing device 102 may be a desktop computer, a point of sale kiosk, an interactive display or monitor (e.g., in a hospital, airport, mall, etc.), and so forth. The computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of an input device coupled to computing device 102 or keys of a virtual keyboard displayed by the display device 110, inputs that are gestures recognized through touchscreen functionality of the display device 110 and that cause operations to be performed that correspond to the gestures, and so forth. The display device 110 is thus also referred to as an interactive display device due to the ability of the display device to receive user inputs via any of various input sensing technologies. The input/output module 108 may support a variety of different input techniques by recognizing and leveraging a division between types of inputs including key presses, gestures, and so on.

Figure 2:
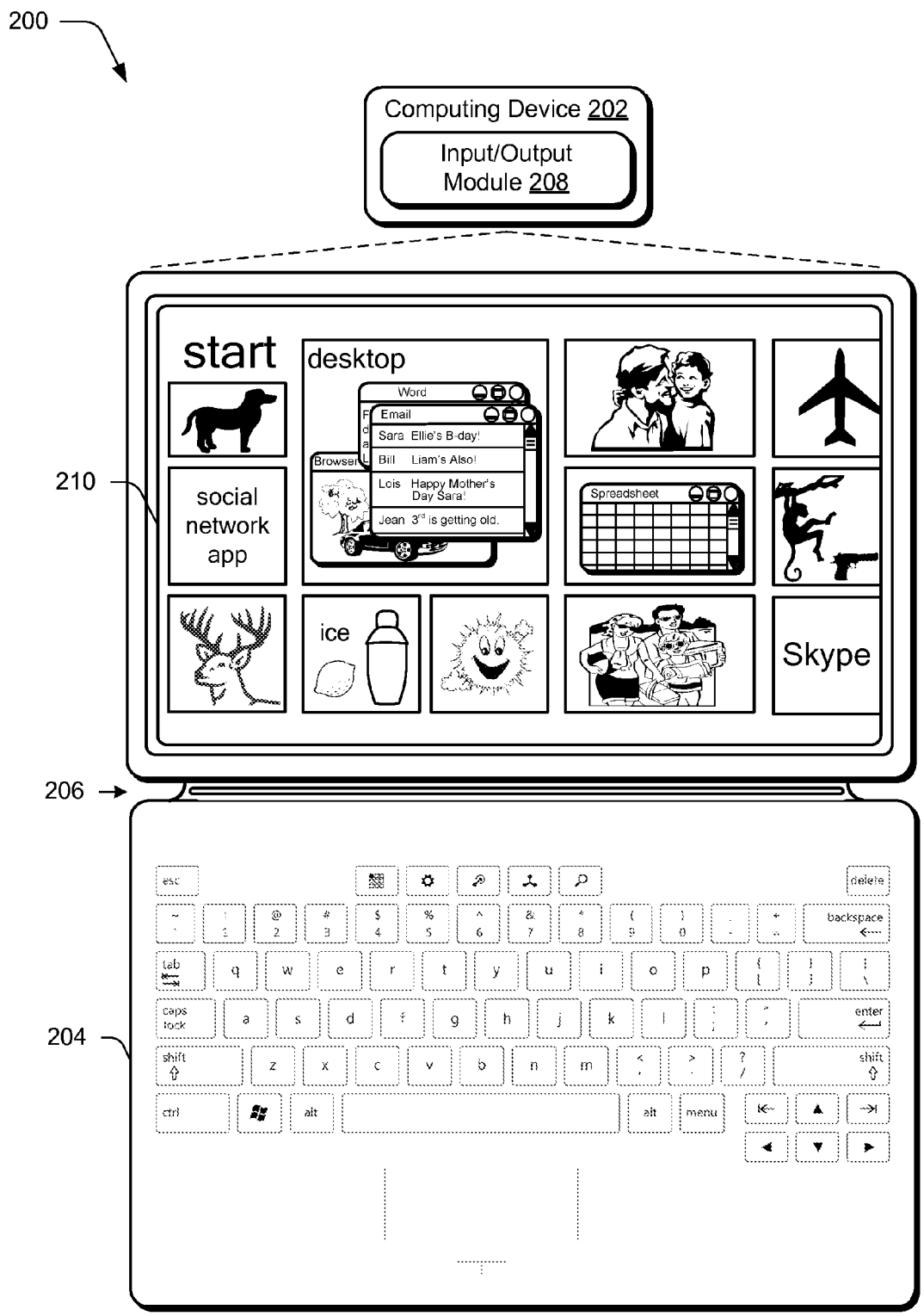
FIG. 2 is an illustration of an environment in another example implementation that is operable to employ the techniques described herein.

FIG. 2 is an illustration of an environment 200 in another example implementation that is operable to employ the techniques described herein. The illustrated environment 200 includes an example of a computing device 202 that is physically and communicatively coupled to an input device 204 via a flexible hinge 206. The computing device 202 may be configured in a variety of ways, analogous to computing device 102 of FIG. 1. The computing device 202 may also relate to software that causes the computing device 202 to perform one or more operations.

The computing device 202, for instance, is illustrated as including an input/output module 208. The input/output module 208 is representative of functionality relating to processing of inputs and rendering outputs of the computing device 202. A variety of different inputs may be processed by the input/output module 208, such as inputs relating to functions that correspond to keys of the input device 204 or keys of a virtual keyboard displayed by the display device 210, inputs that are gestures recognized through touchscreen functionality of the display device 210 and that cause operations to be performed that correspond to the gestures, and so forth. The display device 210 is thus also referred to as an interactive display device due to the ability of the display device to receive user inputs via any of various input sensing technologies. The input/output module 208 may support a variety of different input techniques by recognizing and leveraging a division between types of inputs including key presses, gestures, and so on.

In the illustrated example, the input device 204 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 204 and keys incorporated by the input device 204 may assume a variety of different configurations to support a variety of different functionality.

As previously described, the input device 204 is physically and communicatively coupled to the computing device 202 in this example through use of a flexible hinge 206. The flexible hinge 206 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 204 in relation to the computing device 202. This may be used to support consistent alignment of the input device 204 in relation to the computing device 202, such as to align sensors used to change power states, application states, and so on.

The flexible hinge 206, for instance, may be formed using one or more layers of fabric and include conductors formed as flexible traces to communicatively couple the input device 204 to the computing device 202 and vice versa. This communication, for instance, may be used to communicate a result of a key press to the computing device 202, receive power from the computing device, perform authentication, provide supplemental power to the computing device 202, and so on. The flexible hinge 206 may be configured in a variety of ways, further discussion of which may be found in relation to the following figure.

Figure 3:
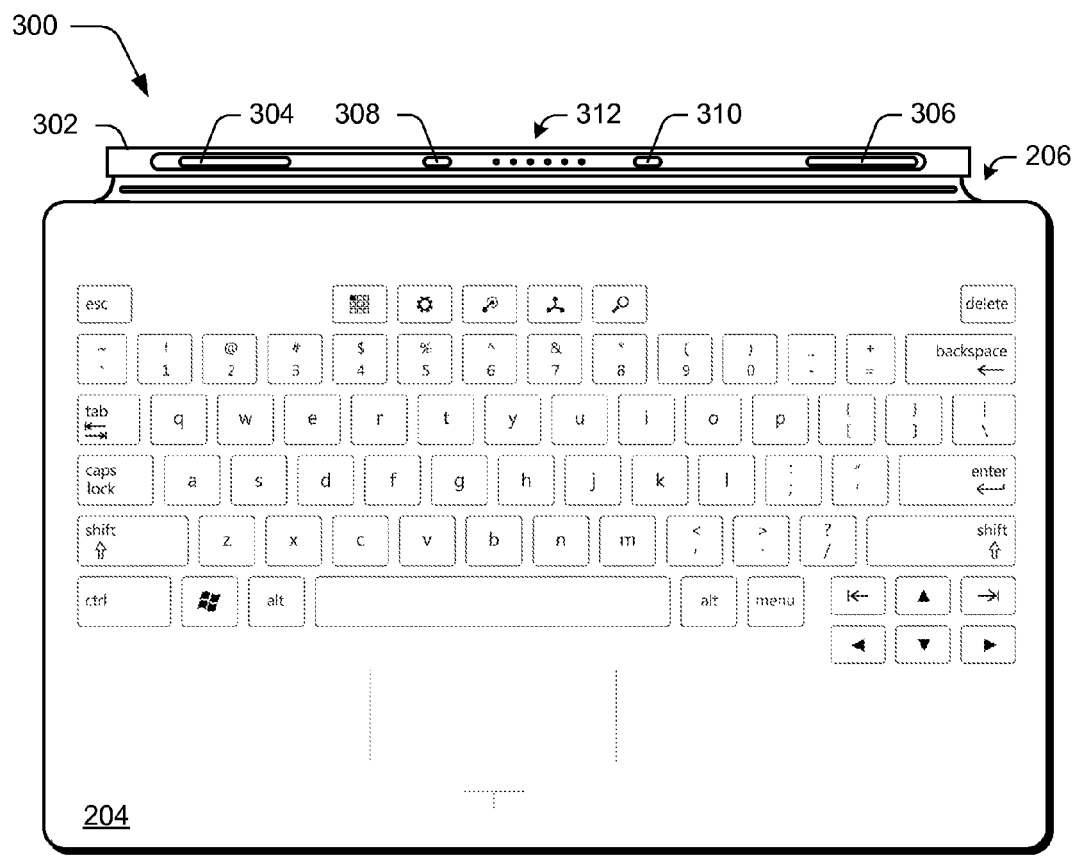
FIG. 3 depicts an example implementation of an input device of FIG. 2 as showing a flexible hinge in greater detail.

FIG. 3 depicts an example implementation 300 of the input device 204 of FIG. 2 as showing the flexible hinge 206 in greater detail. In this example, a connection portion 302 of the input device is shown that is configured to provide a communicative and physical connection between the input device 204 and the computing device 202. In this example, the connection portion 302 has a height and cross section configured to be received in a channel in the housing of the computing device 202, although this arrangement may also be reversed without departing from the spirit and scope thereof.

The connection portion 302 is flexibly connected to a portion of the input device 204 that includes the keys through use of the flexible hinge 206. Thus, when the connection portion 302 is physically connected to the computing device the combination of the connection portion 302 and the flexible hinge 206 supports movement of the input device 204 in relation to the computing device 202 that is similar to a hinge of a book.

For example, rotational movement may be supported by the flexible hinge 206 such that the input device 204 may be placed against the display device 210 of the computing device 202 and thereby act as a cover. The input device 204 may also be rotated so as to be disposed against a back of the computing device 202, e.g., against a rear housing of the computing device 202 that is disposed opposite the display device 210 on the computing device 202.

Naturally, a variety of other orientations are also supported. For instance, the computing device 202 and input device 204 may assume an arrangement such that both are laid flat against a surface as shown in FIG. 2. In another instance, a typing arrangement may be supported in which the input device 204 is laid flat against a surface and the computing device 202 is disposed at an angle to permit viewing of the display device 210, e.g., such as through use of a kickstand disposed on a rear surface of the computing device 202. Other instances are also contemplated, such as a tripod arrangement, meeting arrangement, presentation arrangement, and so forth.

The connecting portion 302 is illustrated in this example as including magnetic coupling devices 304, 306, mechanical coupling protrusions 308, 310, and a plurality of communication contacts 312. The magnetic coupling devices 304, 306 are configured to magnetically couple to complementary magnetic coupling devices of the computing device 202 through use of one or more magnets. In this way, the input device 204 may be physically secured to the computing device 202 through use of magnetic attraction.

The connecting portion 302 also includes mechanical coupling protrusions 308, 310 to form a mechanical physical connection between the input device 204 and the computing device 202. The mechanical coupling protrusions 308, 310 are shown in greater detail in the following figure.

Figure 4:
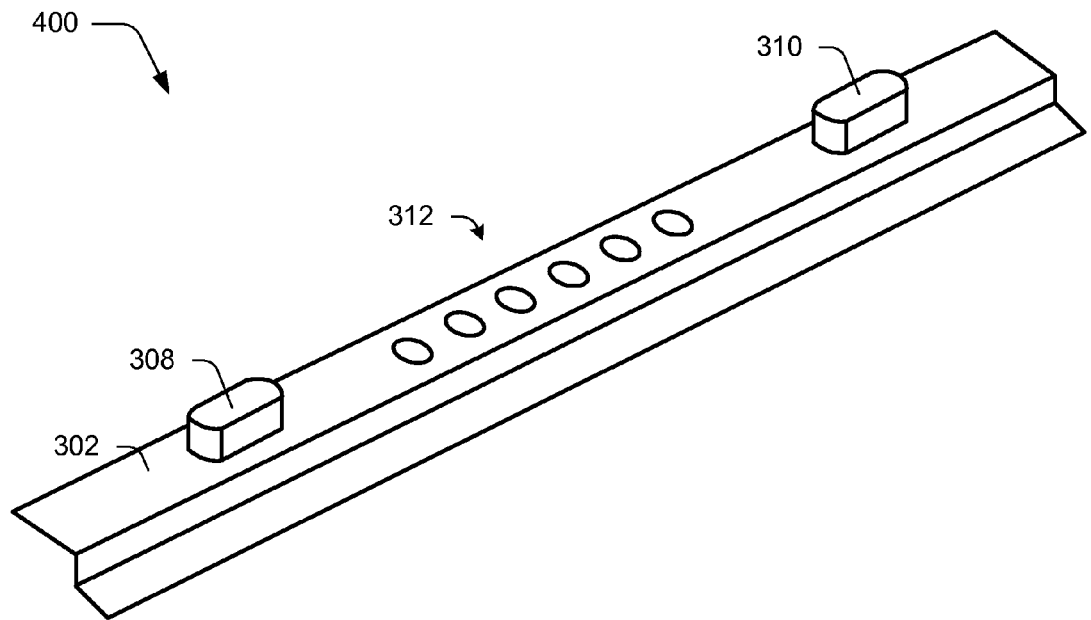
FIG. 4 depicts an example implementation showing a perspective view of a connecting portion of FIG. 3 that includes mechanical coupling protrusions and a plurality of communication contacts.

FIG. 4 depicts an example implementation 400 showing a perspective view of the connecting portion 302 of FIG. 3 that includes the mechanical coupling protrusions 308, 310 and the plurality of communication contacts 312. As illustrated, the mechanical coupling protrusions 308, 310 are configured to extend away from a surface of the connecting portion 302, which in this case is perpendicular although other angles are also contemplated.

The mechanical coupling protrusions 308, 310 are configured to be received within complimentary cavities within the channel of the computing device 202. When so received, the mechanical coupling protrusions 308, 310 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 204 from the computing device 202. However, at other angles the mechanical coupling protrusion 308, 310 are configured to mechanically bind within the cavities, thereby creating a force to resist removal of the input device 204 from the computing device 202 in addition to the magnetic force of the magnetic coupling devices 304, 306. In this way, the mechanical coupling protrusions 308, 310 may bias the removal of the input device 204 from the computing device 202 to mimic tearing a page from a book and restrict other attempts to separate the devices.

The connecting portion 302 is also illustrated as including a plurality of communication contacts 312. The plurality of communication contacts 312 is configured to contact corresponding communication contacts of the computing device 202 to form a communicative coupling between the devices. The communication contacts 312 may be configured in a variety of ways, such as through formation using a plurality of spring loaded pins that are configured to provide a consistent communication contact between the input device 204 and the computing device 202. Therefore, the communication contact may be configured to remain during minor movement of jostling of the devices. A variety of other examples are also contemplated, including placement of the pins on the computing device 202 and contacts on the input device 204.

The sensing user input at display area edge techniques use one or more sensors disposed in an extended sensor area to sense user input outside of an active display area. One or more sensors are also disposed to sense user inputs in the active display area. The extended sensor area is in close proximity to (e.g., within 5 millimeters of) the active display area, and typically is adjacent to the active display area.

Figure 5:
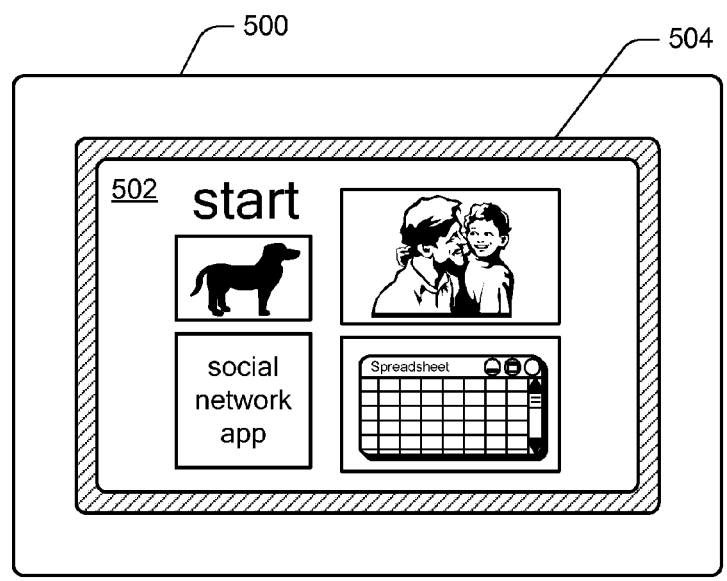
FIG. 5 illustrates an example display device implementing the sensing user input at display area techniques.

FIG. 5 illustrates an example display device 500 implementing the sensing user input at display area techniques. The display device 500 is an interactive display device that includes an active display area 502 in which various data and information may be displayed by the computing device. The display area 502 is referred to as an active display area as the data and information displayed can be changed over time by the computing device, optionally in response to user inputs received by the computing device. The display device 500 also includes an extended sensor area 504, surrounding and adjacent to the active display area 502, illustrated with cross-hatching. User inputs can be received when an object, such as a finger of a user's hand, a stylus, a pen, and so forth is touching and/or in close proximity to the surface of the active display area 502 and/or the surface of the extended sensor area 504. Extended sensor area 504 facilitates sensing user inputs along the edge of the active display area 502. The edge of the active display area 502 refers to the outer perimeter of the active display area 502, which is the portion of the active display area 502 that is closest to the extended sensor area 504.

The extended sensor area 504 can extend, for example, 2 millimeters beyond the active display area 502, although other amounts of extension are contemplated. The extended sensor area 504 can extend the same amount beyond the active display area 502 all around the active display area 502, or alternatively can extend by different amounts. For example, the extended sensor area 504 can extend beyond the active display area 502 by 2 millimeters in the vertical direction and by 4 millimeters in the horizontal direction. The extended sensor area 504 can also vary for different types of devices and be customized to the particular type of device. For example, interactive devices that can receive input from farther away (e.g., point of sale kiosks and interactive displays that can sense input as far away as 10 centimeters) may have extended sensor areas that extend beyond the display area farther (e.g., 10-15 centimeters rather than 2-4 millimeters) than devices that receive input from closer interactions (e.g., a tablet that senses touch).

Display devices implementing the sensing user input at display area edge techniques can use a variety of active display technologies. These active display technologies may include, for example, flexible display technologies, e-reader display technologies, liquid crystal (LCD) display technologies, light-emitting diode (LED) display technologies, organic light-emitting diode (OLED) display technologies, plasma display technologies, and so forth. Although examples of display technologies are discussed herein, other display technologies are also contemplated.

Display devices implementing the sensing user input at display area edge techniques can use a variety of different input sensing technologies. These input sensing technologies may include capacitive systems and/or resistive systems that sense touch. These input sensing technologies may also include inductive systems that sense pen (or other object) inputs. These input sensing technologies may also include optical based systems that sense reflection or disruption of light from objects touching (or close to) the surface of the display device, such as Sensor in Pixel (SIP) systems, Infrared systems, optical imaging systems, and so forth. Other types of input sensing technologies can also be used, such as surface acoustic wave systems, acoustic pulse recognition systems, dispersive signal systems, and so forth. Although examples of input sensing technologies are discussed herein, other input sensing technologies are also contemplated. Furthermore, these input sensing technologies may be combined together, such as a piezoelectric with extended capacitive sensor to provide other tactile input.

Depending on the input sensing technology that is used for a display device, user inputs can be received when an object (such as a finger of a user's hand, a stylus, a pen, and so forth) is touching and/or in close proximity to the surface of the display device. This close proximity can be, for example 5 millimeters, although different proximities are contemplated and can vary depending on the manner in which the display device is implemented. The proximity of an object to the display device refers to a distance the object is from the display device along a direction perpendicular to a plane of the display device.

Figure 6:
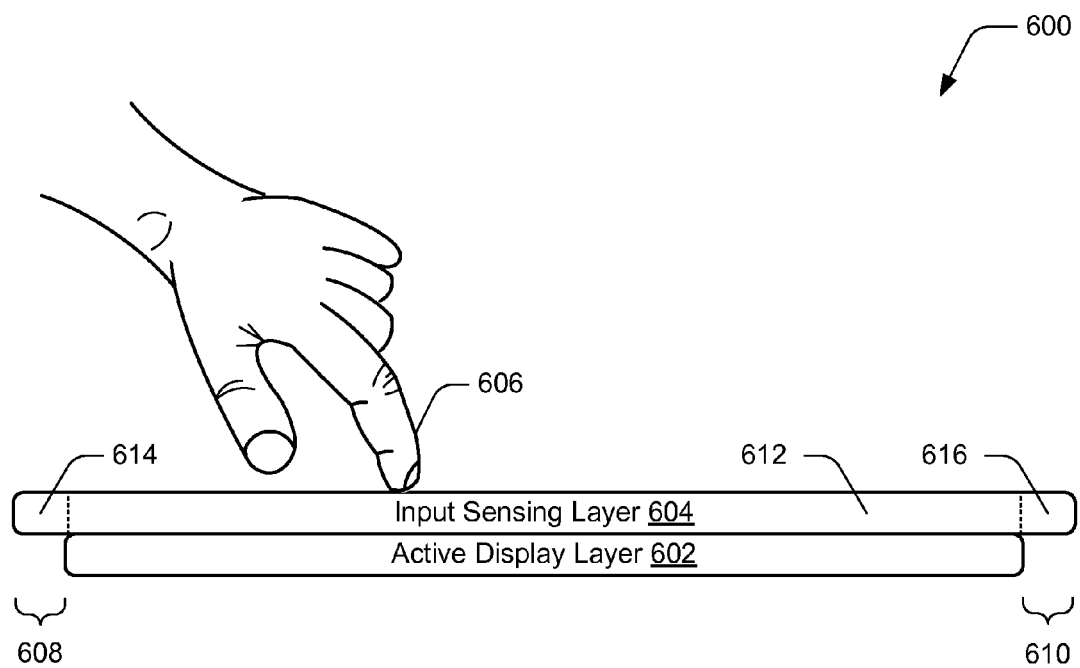
FIG. 6 illustrates a cross section view of an example display device implementing the sensing user input at display area techniques.

FIG. 6 illustrates a cross section view of an example display device 600 implementing the sensing user input at display area techniques. The display device 600 includes an active display layer 602 on top of which is disposed an input sensing layer 604. Although the layers 602 and 604 are illustrated as being individual layers, it should be noted that each of the layers 602 and 604 itself may be made up of multiple layers. The input sensing layer 604 and the active display layer 602 can be implemented using a variety of different technologies, as discussed above. Although not illustrated in FIG. 6, it should be noted that any number of additional layers can be included in the display device 600. For example, an additional protective layer made of glass or plastic can be disposed on top of input sensing layer 604.

A user's finger 606 (or other object) touching or in close proximity to the input sensing layer 604 is sensed by the input sensing layer 604. The locations where the user's finger 606 (or other object) is sensed by the layer 604 is provided by the layer 604 as sensed object locations and are used to identify the user input, as discussed in more detail below.

The input sensing layer 604 includes multiple sensors, and extends beyond the active display area 602 to extended sensor area 608, 610. The number of sensors and manner in which the sensors are disposed may vary based on the implementation and the input sensing technology used for the input sensing layer 604. The input sensing layer 604 includes a portion 612 as well as portions 614 and 616.

One or more sensors may be disposed in the input sensing layer 604 above active display layer 602, in portion 612. These sensors disposed above the layer 602 sense the user's finger 606 (or other object) touching or in close proximity to the layer 604 above the active display layer 602, and thus are also referred to as sensing user input in and/or above the active display area as well as being disposed in the active display area.

One or more sensors may also be disposed in the input sensing layer 604 above extended sensor area 608, 610, in portions 614, 616, respectively. The extended sensor area 608, 610 is not above the active display layer 602, as illustrated in FIG. 6. These sensors disposed above the extended sensor area 608, 610 sense the user's finger 606 (or other object) touching or in close proximity to the layer 604 above the extended sensor area 608, 610, and thus are also referred to as sensing user input in and/or above the extended sensor area 608, 610. Because the extended sensor area 608, 610 is not above the active display layer 602, these sensors disposed above the extended sensor area 608, 610 are also referred to as sensing user input in an area outside of the active display area as well as being disposed in the area outside of the active display area.

Alternatively, sensors may be disposed in the input sensing layer 604 in other manners, such as along the outer edge (the perimeter) of the input sensing layer 604, at corners of the input sensing layer 604, and so forth. Such sensors may still sense user input in and/or above the active display area, as well as user input in an area outside of the active display area.

Figure 7:
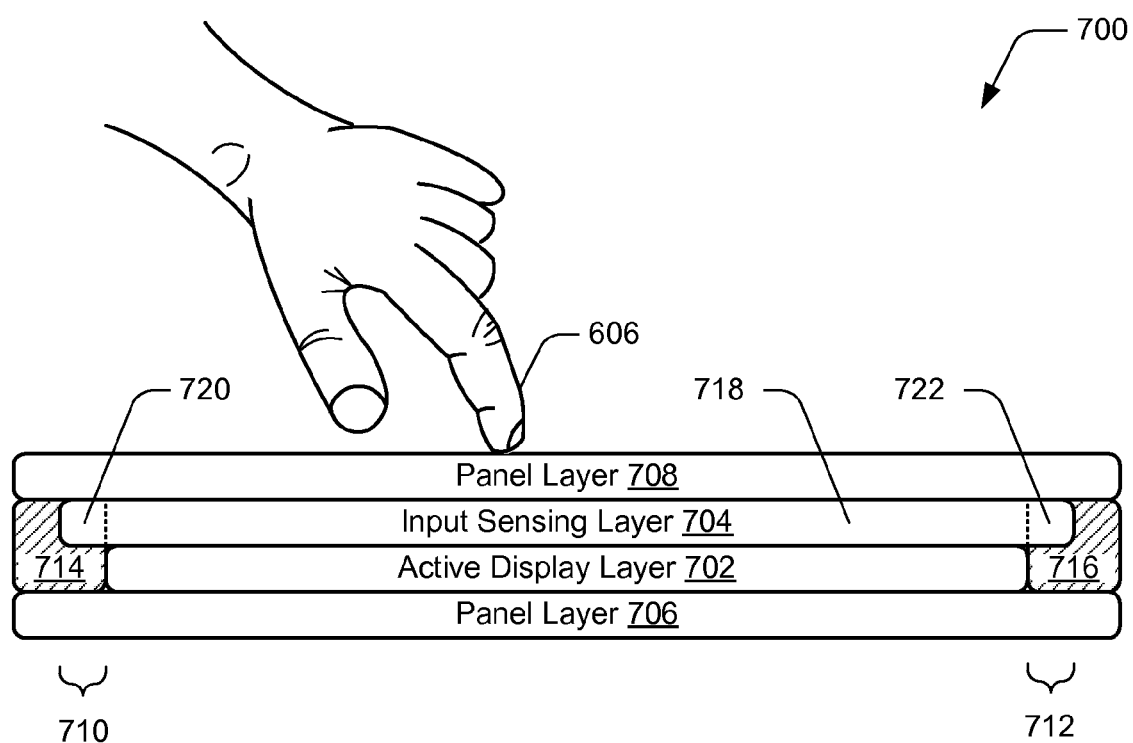
FIG. 7 illustrates a cross section view of another example display device implementing the sensing user input at display area techniques.

FIG. 7 illustrates a cross section view of another example display device 700 implementing the sensing user input at display area techniques. The display device 700 includes an active display layer 702 on top of which is disposed an input sensing layer 704. The input sensing layer 704 and the active display layer 702 can be implemented using a variety of different technologies, as discussed above. The layers 702 and 704 are disposed between a lower panel layer 706 and an upper panel layer 708. The panel layers 706, 708 may be made of various materials, such as glass, plastic, and so forth. Although the layers 702, 704, 706, and 708 are illustrated as being individual layers, it should be noted that each of the layers 702, 704, 706, and 708 itself may be made up of multiple layers. These layers may also be flexible layers, and applicable in 3-dimensional (3Ds) interactive devices.

Additional support material 714, 716 is optionally included between the panel layers 706, 708, illustrated with cross-hatching in FIG. 7. The support material 714, 716 provides additional support for areas between the panel layers to which the layers 702 and 704 do not extend. The support material 714, 716 can be various materials, such as glass, plastic, bonding adhesive, and so forth.

A user's finger 606 (or other object) touching or in close proximity to the input sensing layer 704 is sensed by the input sensing layer 704. The locations where the user's finger 606 (or other object) is sensed by the layer 704 is provided by the layer 704 as sensed object locations and are used to identify the user input, as discussed in more detail below.

The input sensing layer 704 includes multiple sensors, and extends beyond the active display area 702 to extended sensor area 710, 712. Input sensing layer 704 need not, however, extend as far as panel layers 706, 708, as illustrated. The number of sensors included in the input sensing layer 704 and the manner in which the sensors are disposed may vary based on the implementation and the input sensing technology used for the input sensing layer 704. The input sensing layer 704 includes a portion 718 as well as portions 720 and 722.

One or more sensors are disposed in the input sensing layer 704 above active display layer 702, in portion 718. These sensors disposed above the layer 702 sense the user's finger 606 (or other object) touching or in close proximity to the panel layer 708 above the active display layer 702, and thus are also referred to as sensing user input in and/or above the active display area as well as being disposed in the active display area.

One or more sensors are also disposed in the input sensing layer 704 above extended sensor area 710, 712, in portions 720, 722, respectively. The extended sensor area 710, 712 is not above the active display layer 702, as illustrated in FIG. 7. These sensors disposed above the extended sensor area 710, 712 sense the user's finger 706 (or other object) touching or in close proximity to the panel layer 708 above the extended sensor area 710, 712, and thus are also referred to as sensing user input in and/or above the extended sensor area 710, 712. Because the extended sensor area 710, 712 is not above the active display layer 702, these sensors disposed above the extended sensor area 710, 712 are also referred to as sensing user input in an area outside of the active display area as well as being disposed in the area outside of the active display area.

Alternatively, sensors may be disposed in the input sensing layer 704 in other manners, such as along the outer edge (the perimeter) of the input sensing layer 704, at corners of the input sensing layer 704, and so forth. Such sensors may still sense user input in and/or above the active display area, as well as user input in an area outside of the active display area.

It should be noted that, although the input sensing layers in FIGS. 6 and 7 are illustrated as being disposed above the active display layers, other arrangements are contemplated. For example, the input sensing layer can be within or below the active display layer. The input sensing layer can also be of multiple configurations. The input sensing layer may be on both sides of plastic and/or glass substrate, or on the same side of plastic, glass and/or other optical clear layers.

Figure 8:
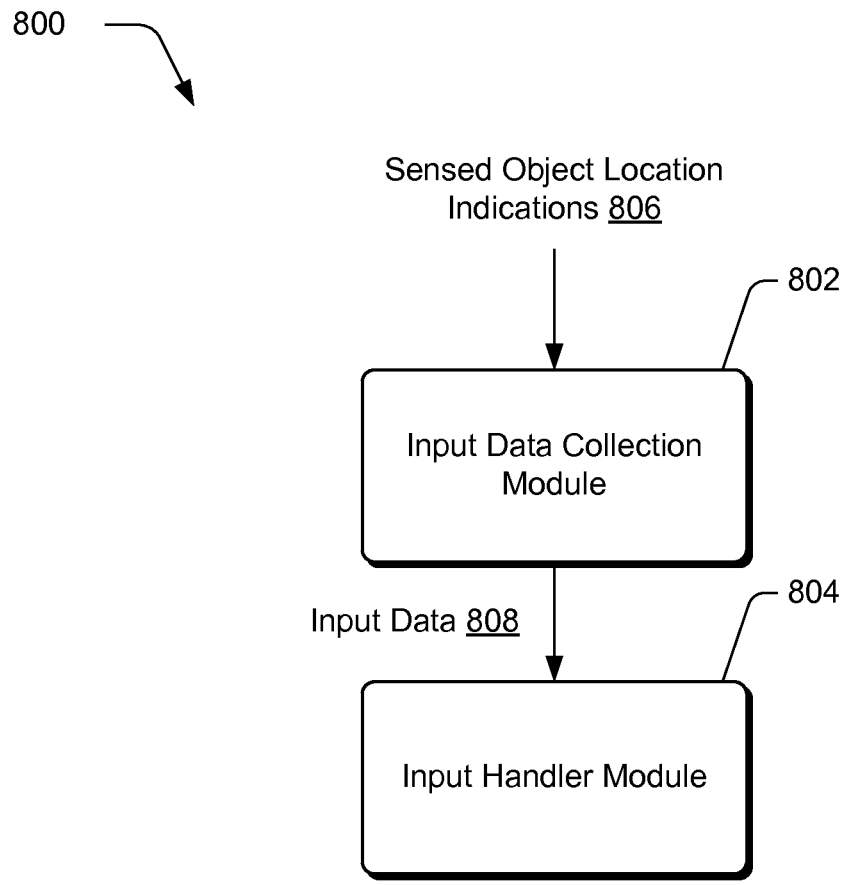
FIG. 8 is an illustration of a system in an example implementation that is operable to employ the techniques described herein.

FIG. 8 is an illustration of a system 800 in an example implementation that is operable to employ the techniques described herein. The system 800 includes an input data collection module 802 and an input handler module 804. System 800 may be implemented, for example, in the computing device 102 of FIG. 1 or the computing device 202 of FIG. 2. Although the modules 802 and 804 are illustrated in the system 800, it should be noted that one or more additional modules may be included in the system 800. It should also be noted that the functionality of the module 802 and/or the module 804 can be separated into multiple modules.

The input data collection module 802 receives indications of sensed object locations 806. These sensed object location indications 806 are indications of locations of an object (e.g., the user's finger or a pen) that were sensed by an input sensing layer of a display device. Timing information associated with the locations that were sensed by the input sensing layer can also optionally be included as part of the sensed object location indications 806. This timing information indicates when a particular location was sensed, and may take different forms. For example, this timing information may be relative to a fixed timeframe or clock, or may be an amount of time since the previous location was sensed. Alternatively, the timing information may be generated by the input data collection module 802 based on the timing of receipt of the sensed object location indications 806.

The input data collection module 802 uses the sensed object location indications 806 to generate input data 808. The input data 808 describes the location and the movement of the user input. The input data 808 can be the sensed object location indications 806, as well as any associated timing information for the locations as received and/or generated by the module 802.

Additionally, a user input can have an associated lifetime, which refers to a time duration that begins when an object touching (or in close proximity to) the surface is sensed and ends when the object is no longer sensed as touching (or in close proximity to) the surface of the display device. This associated lifetime may be identified by the input data collection module 802 and included as part of the input data 808.

A user input can also have an associated velocity, which refers to a velocity at which the object that is sensed is moving. This velocity is a particular distance divided by a particular amount of time, such as a particular number of inches per second, a particular number of millimeters per millisecond, and so forth. This associated velocity may be identified by the input data collection module 802 and included as part of the input data 808, or used in other manners (e.g., to determine when to provide input data 808 to the input handler module 804, as discussed in more detail below).

The input data collection module 802 provides the input data 808 to the input handler module 804, which determines what the user input is. The user input can take various forms, such as a gesture or mouse movement. A gesture refers to a motion or path taken by an object (e.g., the user's finger) to initiate one or more functions of a computing device. For example, a gesture may be sliding of the user's finger in a particular direction, the user's finger tracing a particular character or symbol (e.g., a circle, a letter "Z", etc.), and so forth. A gesture may also include a multi-touch input in which multiple objects (e.g., multiple of the user's fingers) take particular motions or paths to initiate one or more functions of the computing device. A mouse movement refers to a motion or path taken by an object (e.g., the user's finger) to move something (e.g., a cursor or pointer, an object being dragged and dropped, etc.) on the display device. Although gestures and mouse movements are discussed herein, various other types of user inputs are contemplated.

The input handler module 804 may use any of a variety of public and/or proprietary techniques to determine what the user input is based on the input data 808. For example, the input handler module 804 can determine that the user input is a particular gesture, a particular mouse movement, and so forth. The input handler 804 may also be configured to analyze characteristics of the input (e.g., the size of the input and/or velocity of the input) to configure the display or other output for a customized user experience. For example, a small finger with small input can be processed to adjust the font, color, application, and so forth suitable to children.

The input handler module 804 may also, based on the determined user input, take various actions. For example, the input handler module 804 may provide an indication of the determined user input to one or more other modules of the computing device to carry out the requested function or movement. By way of another example, the input handler module 804 itself may carry out the requested function or movement.

The input data collection module 802 may provide the input data 808 to the input handler module 804 at various times. For example, the input data collection module 802 may provide the input data 808 to the input handler module 804 as the input data 808 is generated. By way of another example, the input data collection module 802 may provide the input data 808 to the input handler after the user input has finished (e.g., after the lifetime associated with the user input has elapsed and the object is no longer sensed as touching (or in close proximity to) the surface of the display device).

Alternatively, the input data collection module 802 may maintain the input data 808 for a user input but not provide the input data 808 to the input handler module 804 until a particular event occurs. Various different events can cause the module 802 to provide the input data 808 to the module 804. One event that may cause the module 802 to provide the input data 808 to the module 804 is the user input, as indicated by the location of the object, being in the active display area. Thus, in response to the user input being in the active display area, the module 802 provides the input data 808 to the module 804.

Another event that may cause the module 802 to provide the input data 808 to the module 804 is the user input being outside of the active display area but predicted to be in the active display area in the future (e.g., during an associated lifetime of the user input). The user input can be predicted to be in the active display area in the future based on various rules or criteria, such as based on the velocity of the user input and/or the direction of the user input. For example, if the user input is outside of the active display area and the direction of the user input is towards the active display area, then the user input is predicted to be in the active display area in the future. By way of another example, if the user input is outside of the active display area, the direction of the user input is towards the active display area, and the velocity of the user input is greater than a threshold amount, then the user input is predicted to be in the active display area in the future. This threshold amount can be, for example, 4 inches per second, although other threshold amounts are contemplated. Thus, in response to the user input being predicted to be in the active display area in the future, the module 802 provides the input data 808 to the module 804.

Figure 9:
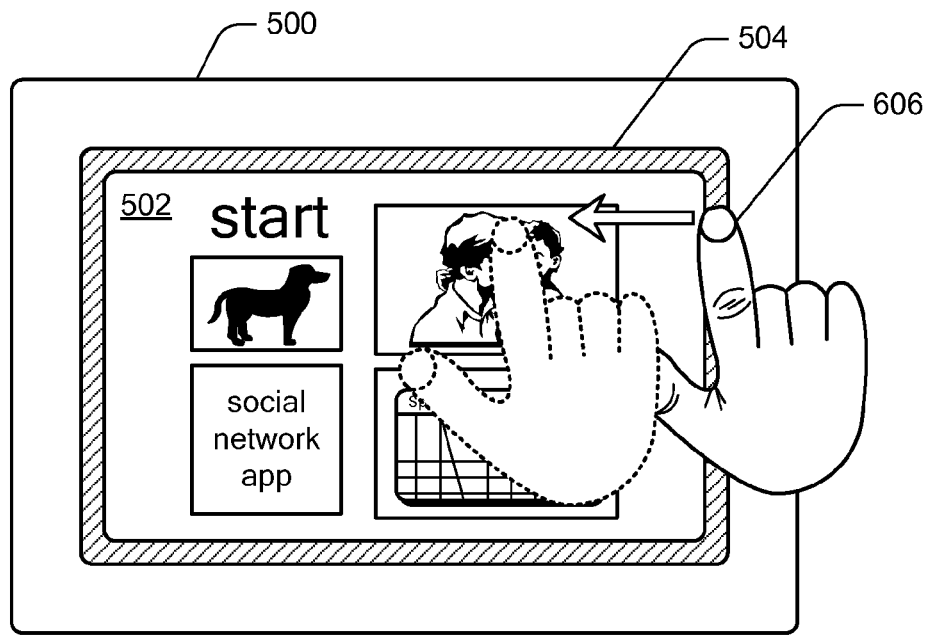
FIG. 9 illustrates the example display device of FIG. 5 with an example user input.

FIG. 9 illustrates the example display device 500 of FIG. 5 with an example user input. The display device 500 includes an active display area 502 surrounded by an extended sensor area 504, illustrated with cross-hatching, as discussed above. A user input is received via a user's finger 606.

The user input in FIG. 9 is illustrated as a movement from right to left, with the user input beginning in the extended sensor area 504 and moving into the active display area 502. The ending position of the user's finger is illustrated using a dashed outline of a hand. Sensing of the user input begins in the extended sensor area 504, prior to the user's finger 606 moving into the active display area 502. The user input indicated by the movement of the user's finger 606 in FIG. 9 may be identified more quickly than if extended sensor area 504 were not included in display device 500. The user input may be identified more quickly because without extended sensor area 504 locations of the user's finger 606 would not begin to be sensed until after the edge of the active display area 502 is reached by the user's finger 606.

The user input in FIG. 9 is illustrated as beginning in extended sensor area 504. However, it should be noted that the user input can begin outside of both the active display area 502 and the extended sensor area 504 (e.g., along an edge of the display device 500). The user input may still be identified more quickly than if extended sensor area 504 were not included in display device 502 because the movement will begin to be sensed when the extended sensor area 504 is reached by the user's finger 606 (rather than waiting until the user's finger 606 reaches the active display area 502).

Figure 10:
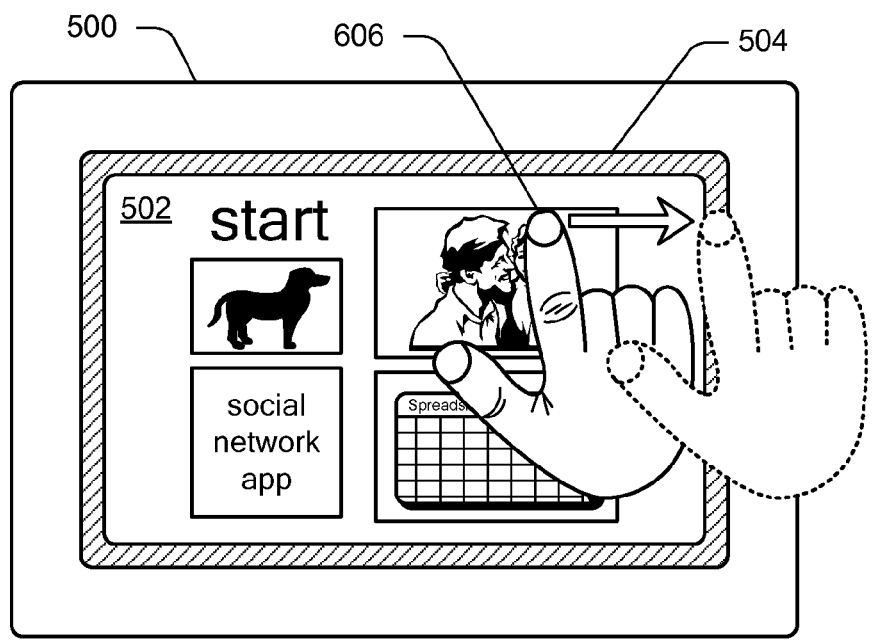
FIG. 10 illustrates the example display device of FIG. 5 with another example user input.

FIG. 10 illustrates the example display device 500 of FIG. 5 with another example user input. The display device 500 includes an active display area 502 surrounded by an extended sensor area 504, illustrated with cross-hatching, as discussed above. A user input is received via a user's finger 606.

The user input in FIG. 10 is illustrated as a movement from left to right, with the user input beginning in the active display area 502 and ending in the extended sensor area 504. The ending position of the user's finger is illustrated using a dashed outline of a hand. Alternatively, the ending position of the movement may be outside of both the active display area 502 and the extended sensor area 504 (e.g., along an edge of the display device 500). Sensing of the user input begins in the active display area, prior to the user's finger 606 moving into the extended sensor area 504. By ending movement of the user's finger 606 in (or having the movement of the user's finger pass through) the extended sensor area 504, the location of the user input in the extended sensor area 504 can be used in identifying the user input. For example, the input handler module 804 of FIG. 8 may determine that the user input is a swipe or gesture from left to right across the display device as opposed to an input that was intended by the user to stop over a particular icon or object displayed near the edge of the display area.

Figure 11:
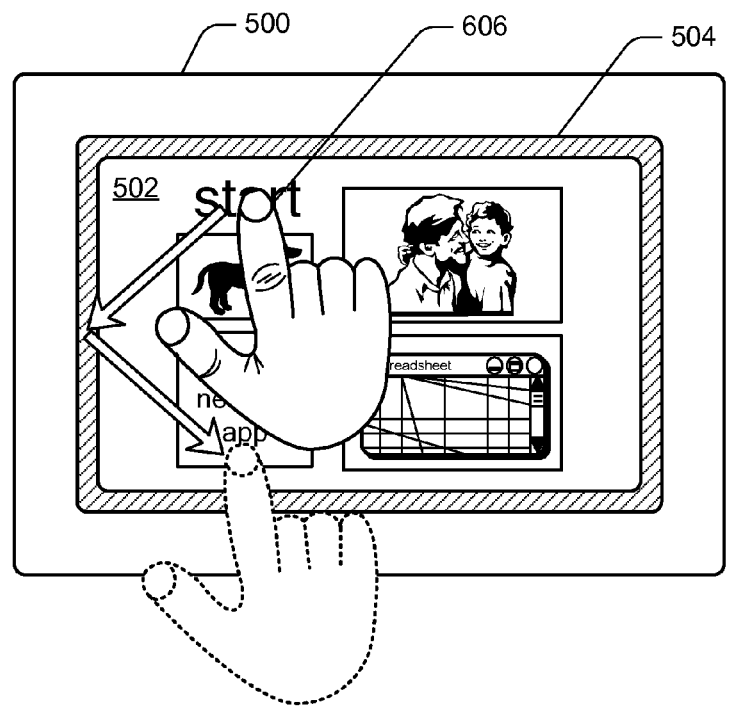
FIG. 11 illustrates the example display device of FIG. 5 with another example user input.

FIG. 11 illustrates the example display device 500 of FIG. 5 with another example user input. The display device 500 includes an active display area 502 surrounded by an extended sensor area 504, illustrated with cross-hatching, as discussed above. A user input is received via a user's finger 606.

The user input in FIG. 11 is illustrated as moving from right to left and from top to bottom in a "<" shape. The user input in FIG. 11 begins and ends in the active display area 504, but passes through the extended sensor area 504. The ending position of the user's finger is illustrated using a dashed outline of a hand. Sensing of the user input in the extended sensor area 504 allows the user input illustrated in FIG. 11 to be input along the edge of the active display area 504. Even though the user input passes outside the edge of the active display area 504, the user input is sensed in the extended sensor area 504.

Figure 12:
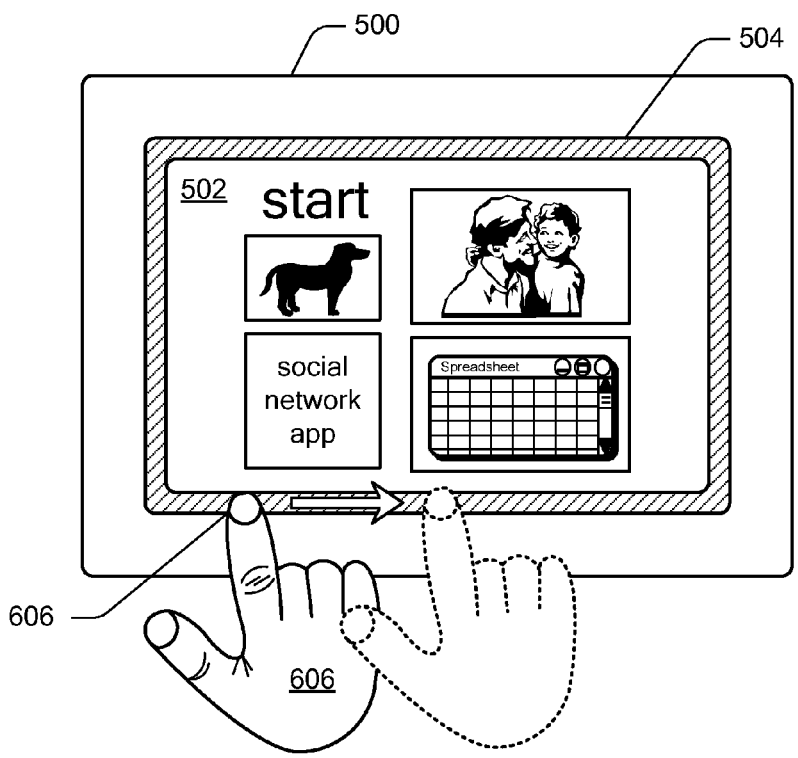
FIG. 12 illustrates the example display device of FIG. 5 with another example user input.

FIG. 12 illustrates the example display device 500 of FIG. 5 with another example user input. The display device 500 includes an active display area 502 surrounded by an extended sensor area 504, illustrated with cross-hatching, as discussed above. A user input is received via a user's finger 606.

The user input in FIG. 12 is illustrated as a movement from left to right, with the user input beginning and ending in the extended sensor area 504 without moving into the active display area 502. The ending position of the user's finger is illustrated using a dashed outline of a hand. Sensing of the user input begins in the extended sensor area 504. However, as the user's finger 606 is not moved into the active display area 502, and the direction of movement of the user's finger 606 is not towards the active display area 502, the input data for the user input need not be provided to the input handler module 804 of FIG. 8. Thus, as the user input remains in the extended sensor area 504, no action based on a user input need be taken.

Figure 13:
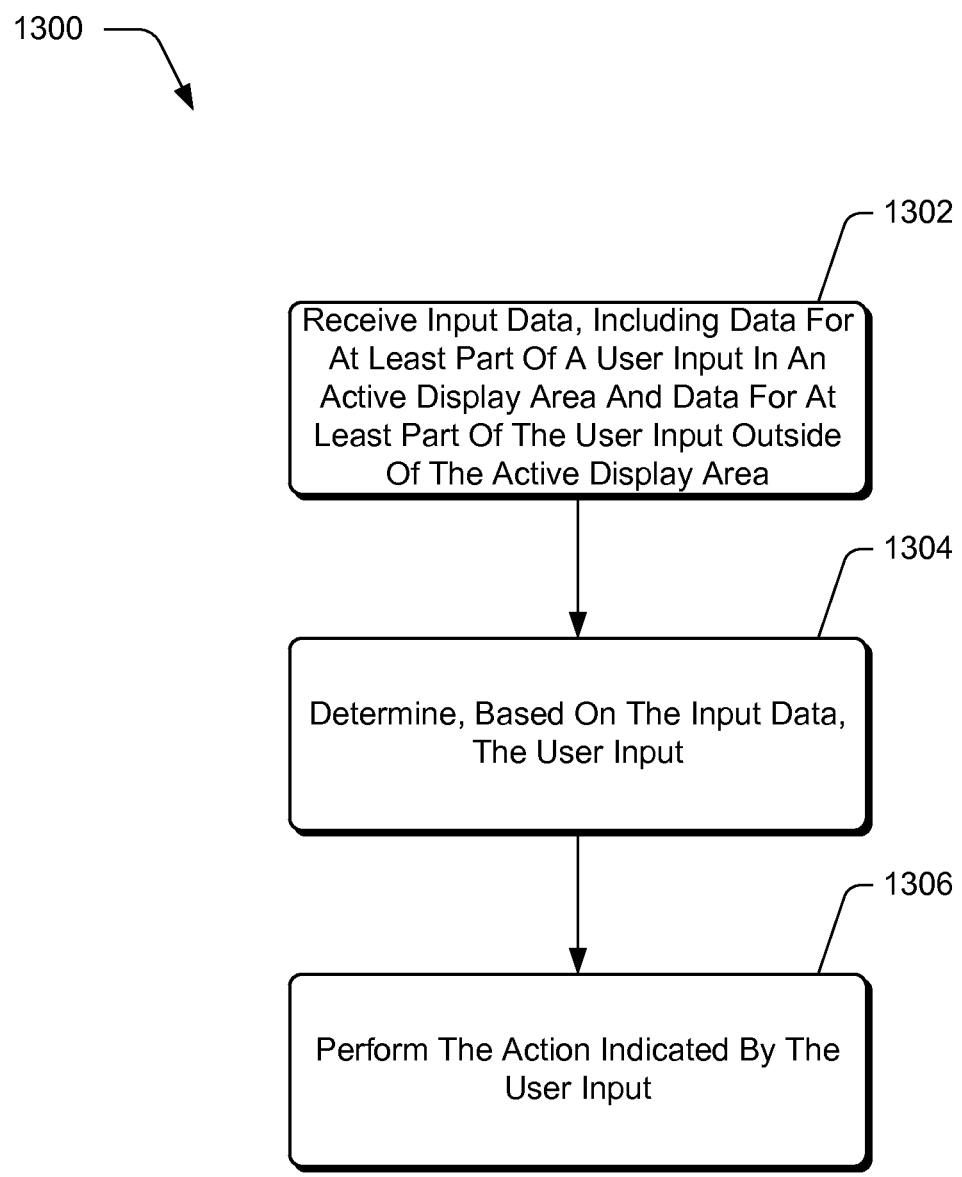
FIG. 13 is a flowchart illustrating an example process for implementing the techniques described herein in accordance with one or more embodiments.

FIG. 13 is a flowchart illustrating an example process 1300 for implementing the techniques described herein in accordance with one or more embodiments. Process 1300 is carried out by a computing device, such as computing device 102 of FIG. 1 or computing device 202 of FIG. 2, and can be implemented in software, firmware, hardware, or combinations thereof. Process 1300 is shown as a set of acts and is not limited to the order shown for performing the operations of the various acts. Process 1300 is an example process for implementing the techniques described herein; additional discussions of implementing the techniques described herein are included herein with reference to different figures.

In process 1300, input data is received (act 1302). The input data includes data for at least part of the user input in an active display area of a device and data for at least part of the user input in an area outside of the active display area of the device, as discussed above.

Based on the input data, the user input is determined (act 1304). Any of a variety of public and/or proprietary techniques may be used to determine what the user input is, as discussed above.

The action indicated by the user input is performed (act 1306). This action may be the performance of various functions or movements, as discussed above.

Example System and Device

Figure 14:
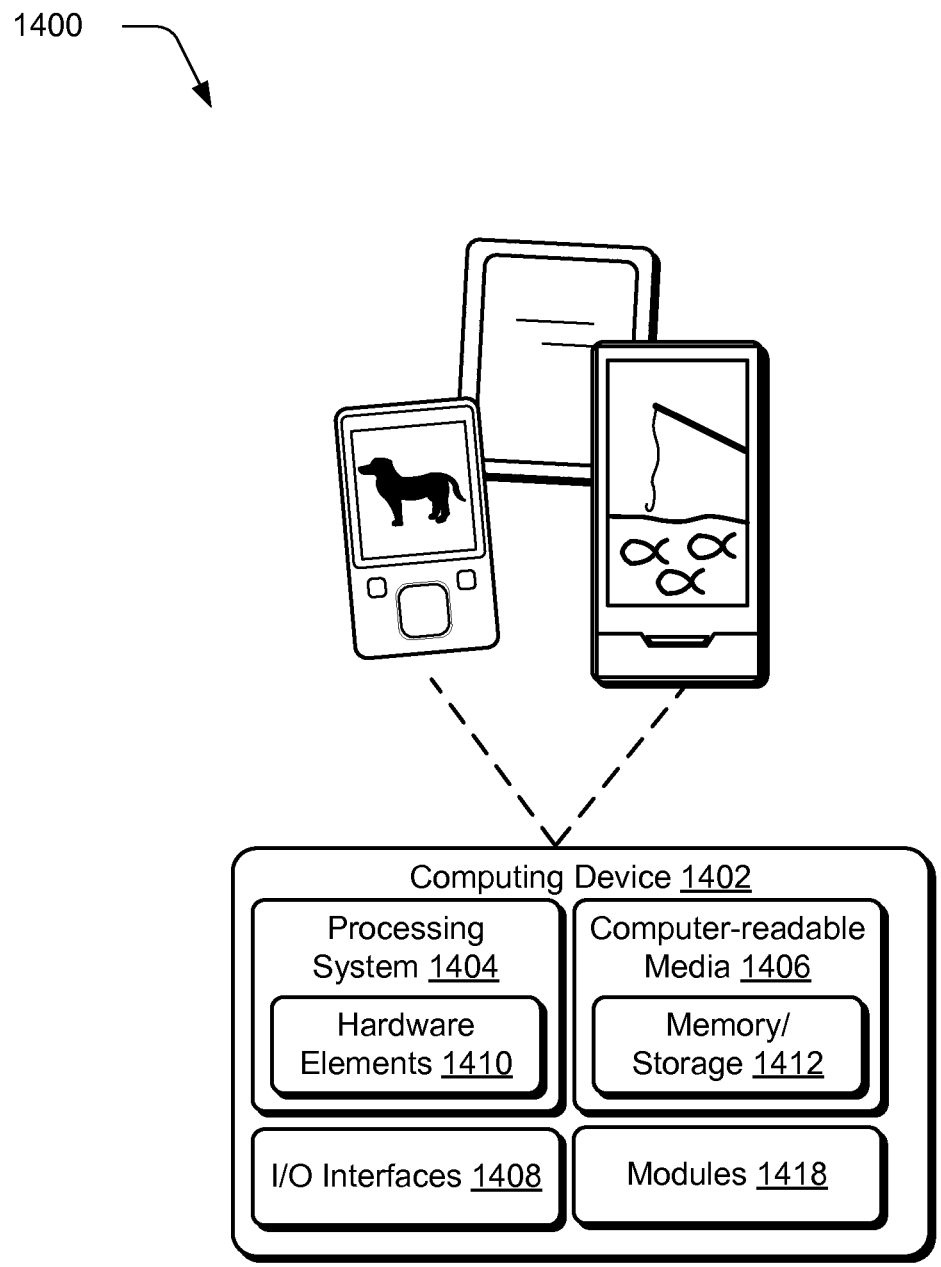
FIG. 14 illustrates an example system including various components of an example device that can be implemented as any type of computing device as described with reference to FIGS. 1-13 to implement embodiments of the techniques described herein.

FIG. 14 illustrates an example system generally at 1400 that includes an example computing device 1402 that is representative of one or more computing systems and/or devices that may implement the various techniques described herein. The computing device 1402 may, for example, be configured to assume a mobile configuration through use of a housing formed and sized to be grasped and carried by one or more hands of a user, illustrated examples of which include a mobile phone, mobile game and music device, and tablet computer although other examples and configurations are also contemplated.

The example computing device 1402 as illustrated includes a processing system 1404, one or more computer-readable media 1406, and one or more I/O interfaces 1408 that are communicatively coupled, one to another. Although not shown, the computing device 1402 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1404 is representative of functionality to perform one or more operations using hardware. Accordingly, the processing system 1404 is illustrated as including hardware element 1410 that may be configured as processors, functional blocks, and so forth. This may include implementation in hardware as an application specific integrated circuit or other logic device formed using one or more semiconductors. The hardware elements 1410 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1406 is illustrated as including memory/storage 1412. The memory/storage 1412 represents memory/storage capacity associated with one or more computer-readable media. The memory/storage component 1412 may include volatile media (such as random access memory (RAM)) and/or nonvolatile media (such as read only memory (ROM), Flash memory, optical disks, magnetic disks, and so forth). The memory/storage component 1412 may include fixed media (e.g., RAM, ROM, a fixed hard drive, and so on) as well as removable media (e.g., Flash memory, a removable hard drive, an optical disc, and so forth). The computer-readable media 1406 may be configured in a variety of other ways as further described below.

Input/output interface(s) 1408 are representative of functionality to allow a user to enter commands and information to computing device 1402, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1402 may be configured in a variety of ways to support user interaction.

The computing device 1402 is further illustrated as including one or more modules 1418 that may be configured to support a variety of functionality. The one or more modules 1418, for instance, may be configured to generate input data based on indications of sensed object locations, to determine what a user input is based on the input data, and so forth. The modules 1418 may include, for example, the input data collection module 802 and/or the input handler module 804 of FIG. 8.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1402. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and nonvolatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1402, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1410 and computer-readable media 1406 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1410. The computing device 1402 may be configured to implement particular instructions and/or functions corresponding to the software and/or hardware modules. Accordingly, implementation of a module that is executable by the computing device 1402 as software may be achieved at least partially in hardware, e.g., through use of computer-readable storage media and/or hardware elements 1410 of the processing system 1404. The instructions and/or functions may be executable/operable by one or more articles of manufacture (for example, one or more computing devices 1402 and/or processing systems 1404) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. A method comprising:
    receiving input data for a user input, the input data having been sensed by one or more sensors, the input data including data indicating first multiple locations touched by an object in an active display area of an interactive display device in which data or information is displayed as well as first timing information indicating when each of the first multiple locations was sensed, the input data further including data indicating second multiple locations touched by the object in an area outside of the active display area of the interactive display device as well as second timing information indicating when each of the second multiple locations was sensed, the area outside of the active display area extending beyond the active display area where there are no display pixels; and
    determining the user input based on the indicated first multiple locations and the indicated first timing information as well as the indicated second multiple locations and the indicated second timing information, the user input comprising a gesture described by a path that includes the first multiple locations and the second multiple locations.

2. A method as recited in claim 1, the user input beginning in the area outside of the active display area and ending in the active display area.

3. A method as recited in claim 1, the user input beginning in the active display area and ending in the area outside of the active display area.

4. A method as recited in claim 1, the user input beginning in the active display area and ending in the active display area, and passing through the area outside of the active display area after beginning the user input and prior to ending the user input.

5. A method as recited in claim 1, the receiving comprising receiving the input data in response to the user input being predicted to be in the active display area in the future.

6. A method as recited in claim 5, the user input being predicted to be in the active display area in the future in response to a direction of the user input being towards the active display area.

7. A method as recited in claim 5, the user input being predicted to be in the active display area in the future in response to both a direction of the user input being towards the active display area and a velocity of the user input being greater than a threshold amount.

8. A method as recited in claim 1, the interactive display device being included in a computing device, and the user input comprising a gesture indicating one or more functions of the computing device to initiate.

9. A method comprising:
    sensing, in a display device having one or more sensors, input data for a user input, the input data including first multiple locations of an active display area of the display device in which data or information is displayed that are touched by an object as well as timing information indicating when each of the first multiple locations was sensed, the input data further including second multiple locations of an area outside of the active display area that are touched by the object as well as timing information indicating when each of the second multiple locations was sensed, the area outside of the active display area extending beyond the active display area where there is no display layer; and
    using the first multiple locations and timing information indicating when each of the first multiple locations was sensed as well as the second multiple locations and timing information indicating when each of the second multiple locations was sensed to determine the user input.

10. A method as recited in claim 9, the user input beginning in the area outside of the active display area and ending in the active display area.

11. A method as recited in claim 9, the user input beginning in the active display area and ending in the area outside of the active display area.

12. A method as recited in claim 9, the user input beginning in the active display area and ending in the active display area, and passing through the area outside of the active display area after beginning the user input and prior to ending the user input.

13. A method as recited in claim 9, the object comprising a finger of a user providing the user input.

14. A method as recited in claim 9, the area outside of the active display area comprising an extended sensor area surrounding and adjacent to the active display area.

15. A computing device comprising a housing and a display device supported by the housing and having an active display area in which data or information is displayed, and an area outside of the active display area extending beyond the active display area where there are no display pixels, the display device having one or more sensors disposed for sensing first multiple locations of the active display area that are touched by an object while inputting a user input to the computing device as well as second multiple locations outside of the active display area that are touched by the object while inputting the user input, the computing device determining the user input based on both the first multiple locations of the active display area that are touched by the object and the second multiple locations outside of the active display area that are touched by the object, as well as based on timing information indicating when each of the first multiple locations was sensed by the one or more sensors and when each of the second multiple locations was sensed by the one or more sensors.

16. A computing device as recited in claim 15, at least one of the one or more sensors being disposed in an extended sensor area surrounding the active display area such that locations of the object are sensed by the computing device along the edge of the active display area before locations of the object are sensed by the computing device in the active display area.

17. A computing device as recited in claim 15, the one or more sensors being included in an input sensor layer of the display device extending beyond an active display layer of the display device.

18. A computing device as recited in claim 15, the area outside of the active display area comprising an extended sensor area surrounding and adjacent to the active display area.

19. A computing device as recited in claim 18, the extended sensor area extending approximately two millimeters outside the active display area.

20. A computing device as recited in claim 15, the user input comprising a gesture indicating one or more functions of the computing device to initiate.

* * * * *